(12) United States Patent
Sugiyama

(10) Patent No.: US 8,053,957 B2
(45) Date of Patent: Nov. 8, 2011

(54) PIEZOELECTRIC VIBRATING PIECE HAVING ARM ENDS WITH EXCITATION ELECTRODES OF OPPOSITE POLARITY AND PIEZOELECTRIC VIBRATOR, OSCILLATORY, ELECTRONIC APPARATUS AND RADIO WAVE TIMEPIECE HAVING SAME

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 342 days.

(21) Appl. No.: 12/372,264

(22) Filed: Feb. 17, 2009

(65) Prior Publication Data

US 2009/0212668 A1 Aug. 27, 2009

(30) Foreign Application Priority Data

Feb. 26, 2008 (JP) .................................. 2008-044388

(51) Int. Cl.
*H03H 9/19* (2006.01)
(52) U.S. Cl. .................. 310/370; 310/344; 310/365
(58) Field of Classification Search .................. 310/370, 310/344, 348, 365
See application file for complete search history.

(56) References Cited

U.S. PATENT DOCUMENTS

| | | | | |
|---|---|---|---|---|
| 4,191,906 A | * | 3/1980 | Kogure | 310/370 |
| 6,439,051 B2 | * | 8/2002 | Kikuchi et al. | 73/504.12 |
| 7,043,986 B2 | * | 5/2006 | Kikuchi et al. | 73/504.12 |
| 7,126,262 B2 | * | 10/2006 | Kawauchi et al. | 310/367 |
| 7,140,251 B2 | * | 11/2006 | Kawauchi et al. | 73/504.16 |
| 2005/0140252 A1 | * | 6/2005 | Miyata et al. | 310/370 |

FOREIGN PATENT DOCUMENTS

JP 2002-261575 9/2002

* cited by examiner

*Primary Examiner* — Jaydi San Martin
(74) *Attorney, Agent, or Firm* — Brinks Hofer Gilson & Lione

(57) ABSTRACT

To achieve small-sized formation by shortening a total length after ensuring a length of a base portion capable of sufficiently reducing vibration leakage, there is provided a piezoelectric vibrating piece 2 including a piezoelectric plate 10 including a pair of vibrating arm portions 11, 12 arranged in parallel with each other in a state of being extended in one direction from base ends to front ends, and a base portion 13 having connecting portions 13a respectively connected to the pair of vibrating arm portions at middle positions from the base ends to the front ends for integrally supporting the pair of vibrating arm portions by way of the connecting portions, exciting electrodes 20, 21 respectively formed on outer surfaces of the pair of vibrating arm portions for vibrating the pair of vibrating arm portions when a drive voltage is applied thereto, a pair of mount electrodes 22, 23 formed on an outer surface of the base portion and electrically connected respectively to the pair of exciting electrodes, in which at least a portion of the base portion is arranged to be interposed between the pair of vibrating arm portions.

12 Claims, 28 Drawing Sheets

FIG. 19
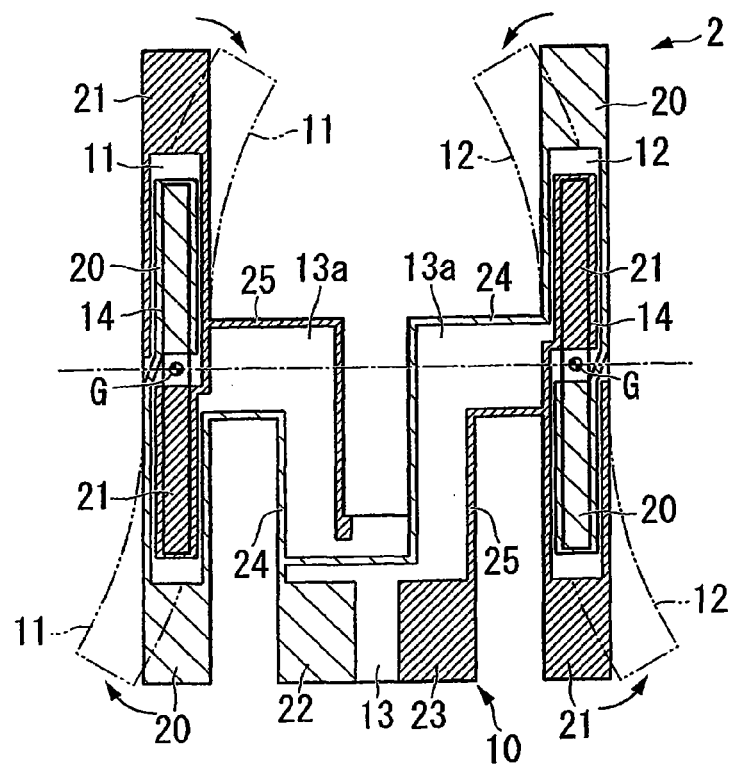
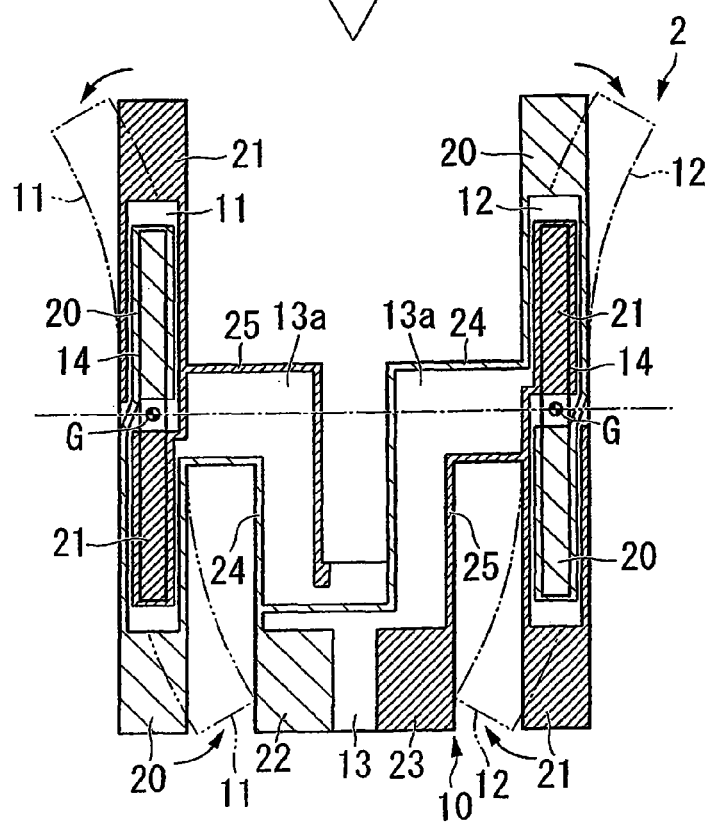

PIEZOELECTRIC VIBRATING PIECE HAVING ARM ENDS WITH EXCITATION ELECTRODES OF OPPOSITE POLARITY AND PIEZOELECTRIC VIBRATOR, OSCILLATORY, ELECTRONIC APPARATUS AND RADIO WAVE TIMEPIECE HAVING SAME

RELATED APPLICATION

This application claims priority under 35 U.S.C. §119 to Japanese Patent Application No. JP2008-044388 filed on Feb. 26, 2008, the entire content of which is hereby incorporated by reference

BACKGROUND OF THE INVENTION

The present invention relates to a piezoelectric vibrating piece made of a piezoelectric material of quartz, lithium tantalate or the like, a piezoelectric vibrator having the piezoelectric vibrating piece, an oscillator, an electronic apparatus and a radiowave timepiece having the piezoelectric vibrator as well as a method of fabricating a piezoelectric vibrating piece.

DESCRIPTION OF THE RELATED ART

In recent years, a portable telephone or a portable information apparatus uses a piezoelectric vibrator utilizing quartz or the like as a time source, a timing source of a control signal or a reference signal source or the like. As a piezoelectric vibrator of this kind, various ones are provided, as one thereof, a piezoelectric vibrator of a cylinder package type sealing a piezoelectric vibrating piece at inside of a case in a shape of circular cylinder is known.

As shown by FIG. 40, a piezoelectric vibrator 200 includes a piezoelectric vibrating piece 201 of a tuning fork type, a case 202 in a shape of a bottomed cylinder containing the piezoelectric vibrating piece 201 at inside thereof, and an airtight terminal 203 of hermetically closing the piezoelectric vibrating piece 201 at inside of the case 202.

The piezoelectric vibrating piece 201 is a vibrating piece of a tuning fork type formed by various piezoelectric materials, and includes a piezoelectric plate 212 constituted by a pair of vibrating arm portions 210 arranged in parallel, and a base portion 211 integrally fixed to base end sides of the pair of vibrating arm portions 210, and an electrode, not illustrated, formed on an outer surface of the piezoelectric plate 212.

Further, the electrode is constituted by exciting electrodes formed on outer surfaces of the pair of vibrating arm portions 210 for vibrating the vibrating arm portions 210, and mount electrodes formed on an outer surface of the base portion 212 and electrically connected to exciting electrodes by way of leadout electrodes.

An airtight terminal 203 is constituted by a stem 215 in a ring-like shape formed by a metal material, 2 pieces of lead terminals 216 arranged to penetrate the stem 215, and a filling member 217 of integrally fixing the lead terminal 216 and the stem 215 in an insulating state for hermetically closing inside of the case 202.

Portions of 2 pieces of the lead terminals 216 projected to inside of the case 202, supporting the piezoelectric plate 212 and connected to the mount electrodes are made to constitute inner leads 216a and portions thereof projected to outside of the case 202 are made to constitute outer leads 216b. Further, the outer leads 216b is made to function as an external portion connecting terminal.

Further, the case 202 is press-fit to be fitted to be fixed to an outer periphery of the stem 215. The case 202 is press-fit in a vacuum atmosphere, and therefore, a space surrounding the piezoelectric vibrating piece 201 at inside of the case 202 is hermetically closed in a state of being maintained in vacuum.

According to the piezoelectric vibrator 200 constituted in this way, when a drive voltage is applied respectively to the outer leads 216b of 2 pieces of the lead terminals 216, a current is made to flow from the inner leads 216a to the piezoelectric vibrating piece 201 by way of the mount electrodes. Thereby, the piezoelectric vibrating piece 201 is oscillated by a predetermined frequency.

Meanwhile, in recent years, as is represented by a portable telephone or the like, small-sized formation of various electronic apparatus including a piezoelectric vibrator is progressed. Therefore, also with regard to a piezoelectric vibrator, further small-sized formation is requested.

Particularly, in a surface mounting type piezoelectric vibrator of a package type (glass package, ceramic package or the like) of containing a piezoelectric vibrating piece between a base board and a lid board, or a surface mounting type piezoelectric vibrator of a mold type (a piezoelectric vibrator of the above-described cylinder package type is molded by a resin), a mounting area of which is regarded to be larger than that of the piezoelectric vibrator of this type, it is made to be effective to shorten a total length in order to achieve small-sized formation. This is because by shortening the total length, the mounting area can be reduced, which can amount to small-sized formation comparatively easily.

Hence, also with regard to the piezoelectric vibrating piece of the tuning fork type, there is a request for realizing smalls-sized formation by shortening the total length.

Meanwhile, in order to shorten the total length of the piezoelectric vibrating piece of the tuning fork type, it is effective to shorten a length of the vibrating arm portion or a length of the base portion. However, when the length of the vibrating arm portion is designated by L and a width of the vibrating arm portion is designated by W, a frequency F of the piezoelectric vibrating piece of the tuning fork type is proportional to $W/L^2$. Therefore, when a length of the vibrating arm portion is shortened, in order to maintain the same frequency F, it is necessary to reduce also the width of the vibrating arm portion more than the length of the vibrating arm portion. Therefore, there is necessarily a limit in view of working and there is a limit in achieving small-sized formation of the piezoelectric vibrating piece by the length of the vibrating arm portion.

Further, as a device for restraining a vibration loss by reducing CI value (Crystal Impedance), it is known to constitute a vibrating arm portion of a section of H type by forming groove portions on both faces of the vibrating arm portion. According to the method, although a rate of reducing the width of the vibrating arm portion can be reduced in comparison with that of the case of not forming the groove portion, the method is not so an effective method as amounting to further small-sized formation of the piezoelectric vibrating piece.

On the other hand, although a total length of the piezoelectric vibrating piece of the tuning fork type can be shortened by shortening the length of the base portion, a drawback described below is brought about.

That is, when the length of the base portion is shortened, the vibration of the vibrating arm portion is liable to be unstable and there is a concern of bringing about leakage of vibration (leakage of vibration energy) through the base portion and the CI value becomes unstable.

Hence, as a measure of reducing the vibration leakage, it is proposed to form a cut portion at a base portion (refer to JP-A-2002-261575).

However, when the cut portion is formed at the base portion, although the vibration leakage can be reduced in comparison with a case of not forming the cut portion, the vibration leakage is considerably brought about in comparison with that in a case in which the length of the base portion is long. Therefore, it is not regarded to be effective in reality to shorten the length of the base portion.

SUMMARY OF THE INVENTION

The invention has been carried out in consideration of such a situation and it is an object thereof to provide a piezoelectric vibrating piece capable of achieving small-sized formation by shortening a total length after ensuring a length of a base portion capable of reducing sufficiently vibration leakage, and a method of fabricating a piezoelectric vibrating piece of fabricating the piezoelectric vibrating piece.

Further, it is an object thereof to provide a piezoelectric vibrator having the piezoelectric vibrating piece, an oscillator, an electronic apparatus and a radiowave timepiece having the piezoelectric vibrator.

The invention provides the following means in order to resolve the problem.

A piezoelectric vibrating piece according to the invention comprises a piezoelectric plate including a pair of vibrating arm portions arranged in parallel with each other in a state of being extended in one direction from base ends to front ends, and a base portion having connecting portions respectively connected to the pair of vibrating arm portions at middle positions of the base ends to the front ends and integrally supporting the pair of vibrating arm portions by way of the connecting portions, exciting electrodes respectively formed on outer surfaces of the pair of vibrating arm portions for vibrating the pair of vibrating arm portions when a drive voltage is applied thereto, and a pair of mount electrodes formed on an outer surface of the base portion and respectively electrically connected to the pair of exciting electrodes, wherein the base portion is arranged to be interposed between the pair of vibrating arm portions at least one portion thereof.

Further, a method of fabricating a piezoelectric vibrating piece according to the invention is a method of fabricating a plurality of piezoelectric vibrating pieces at a time utilizing a wafer made of a piezoelectric material, the method comprising an outer shape forming step of forming a plurality of outer shapes of piezoelectric plates each having a pair of vibrating arm portions arranged in parallel with each other in a state of being extended in one direction from base ends to front ends thereof and a base portion integrally supporting the pair of vibrating arm portions by way of connecting portions respectively connected to the pair of vibrating arm portions at middle positions from the base ends to the front ends at the wafer by etching the wafer by a photolithography technology, an electrode forming step of forming exciting electrodes for vibrating the pairs of vibrating arm portions when a drive voltage is applied thereto on outer surfaces of the plurality of piezoelectric plates and forming pairs of mount electrodes respectively connected electrically to the pairs of exciting electrodes on an outer surface of the base portion by patterning an electrode film on outer surfaces of the plurality of piezoelectric plates, and a cutting step of cutting to separate the plurality of piezoelectric plates from the wafer to fragment, wherein in the outer shape forming step, the outer shape of the piezoelectric plate is formed such that at least a portion of the base portion is interposed between the pair of vibrating arm portions.

In the piezoelectric vibrating piece and the method of fabricating the piezoelectric vibrating piece according to the invention, first, there is carried out the outer shape forming step of forming the outer shapes of the plurality of piezoelectric plates at the wafer by etching the wafer made of the piezoelectric material of quartz or the like by the photolithography technology. At this occasion, the outer shape is formed to constitute the piezoelectric plate the pair of vibrating arm portions arranged in parallel with each other and the base portion integrally supporting the pair of vibrating arm portions by way of the connecting portions respectively connected to the pair of vibrating arm portions at middle positions from the base ends to the front ends. Particularly, the outer shape is formed such that at least a portion of the base portion is interposed between the pair of vibrating arm portions.

Next, there is carried out the electrode forming step of forming the pair of exciting electrodes and the pair of mount electrodes by patterning the electrode film on the outer surfaces of the plurality of piezoelectric plates. At this occasion, the patterning is carried out such that the pair of exciting electrodes are formed on the outer surfaces of the pair of vibrating arm portions and the pair of mount electrodes are formed on the outer surface of the base portion.

Further, there is carried out the cutting step of cutting to separate the plurality of piezoelectric plates from the wafer to fragment. Thereby, the plurality of piezoelectric vibrating pieces of a tuning fork type can be fabricated at a time from the single wafer.

Particularly, the base portion of supporting the pair of vibrating arm portions supports the middle positions of the vibrating arm portions by way of the connecting portions different from the background art of supporting the base end sides of the vibrating arm portions. Further, the base portion is arranged such that at least the portion is interposed between the pair of vibrating arm portions. Therefore, a length of a total can be shortened by an amount of a length of the base portion interposed between the pair of vibrating arm portions.

That is, in the background art, the base portion supports the base end sides of the pair of vibrating arm portions, and therefore, the length of the total is constituted by summing up the length of the vibrating arm portion and the length of the base portion. However, as described above, since at least a portion of the base portion is arranged to be interposed between the pair of vibrating arm portions, and therefore, even when the length of the base portion is the same as that of the background art, the length of the total can be shortened.

As a result, small-sized formation can be achieved by shortening the total length of the piezoelectric vibrating piece. Further, it is not necessary to shorten the length of the base portion, and therefore, the state of sufficiently reducing vibration leakage can be maintained.

In this way, small-sized formation can be achieved by shortening a total length after ensuring the length of the base portion capable of sufficiently reducing vibration leakage.

Further, according to the piezoelectric vibrating piece of the invention, in the above-described piezoelectric vibrating piece of the invention, the connecting portion is connected to a gravitational center position of the vibrating arm portion in a length direction.

Further, according to the method of fabricating the piezoelectric vibrating piece of the invention, in the outer shape forming step, the outer shape of the piezoelectric plate is formed such that the connecting portion is connected to a gravitational center position of the vibrating arm portion in a length direction.

In the piezoelectric vibrating piece and the method of fabricating the piezoelectric piece according to the invention, the base portion supports the gravitational position of the vibrating arm portion in the length direction by way of the connecting portion, and therefore, when the pair of vibrating arm portions are vibrated, rocking becomes uniform at the base end side and the front end side centering on the connecting portion, and the vibrating arm portion can stably be vibrated without deflection. Therefore, the vibrating state stable over a long period of time can be continued to maintain and high performance formation can be achieved.

Further, according to the piezoelectric vibrating piece of the invention, in the above-described piezoelectric vibrating piece of the invention, the pair of exciting electrodes are patterned such that polarities thereof are reversed at base end sides and front end sides of the vibrating arm portions by constituting boundaries by the connecting portions.

Further, according to the method of fabricating the piezoelectric vibrating piece of the invention, in the above-described method of fabricating the piezoelectric vibrating piece of the invention, in the electrode forming step, the pair of exciting electrodes are formed such that polarities are reversed at a base end side and a front end side of the vibrating arm portion by constituting a boundary by the connecting portion.

In the piezoelectric vibrating piece and the method of fabricating the piezoelectric vibrating piece according to the invention, the pair of exciting electrodes are formed such that the polarities are reversed at the base end sides and the front end sides of the vibrating arm portions by constituting the boundaries by the connecting portions, and therefore, when the drive voltage is applied thereto, the vibrating arm portions are vibrated while bending the front end sides and the base end sides in reverse directions. That is, the vibrating arm portion is vibrated by a vibration mode of reversing a bending direction by constituting the boundary by the connecting portion. As a result, the pair of vibrating arm portions can respectively be vibrated to rotate by constituting base points by the connecting portions.

According to the piezoelectric vibrating piece of the invention, in the above-described piezoelectric vibrating piece of the invention, the pair of vibrating arm portions are respectively formed with groove portions at both faces thereof along the length direction.

Further, according to the method of fabricating the piezoelectric vibrating piece of the invention, in the above-descried method of fabricating the piezoelectric vibrating piece of the invention, in the outer shape forming step, both faces of the pair of vibrating arm portions are respectively formed with groove portions along the length direction.

In the piezoelectric vibrating piece and the method of fabricating the piezoelectric vibrating piece according to the invention, the groove portions are respectively formed on the both faces of the pair of vibrating arm portions, and therefore, when the drive voltage is applied, a field efficiency between the pair of exciting electrodes can be increased. Therefore, vibration loss can be restrained and vibration property can be promoted. Therefore, the CI value (Crystal Impedance) and the resonance frequency can be reduced and high function formation of the piezoelectric vibrating piece can be achieved.

Further, according to the piezoelectric vibrating piece of the invention, in the above-described piezoelectric vibrating piece of the invention, the pair of vibrating arm portions are formed with through holes penetrating both faces thereof along the length direction.

Further, according to the method of fabricating the piezoelectric vibrating piece of the invention, in the above-described method of fabricating the piezoelectric vibrating piece, in the outer shape forming step, the pair of vibrating arm portions are formed with through holes penetrating both faces along the length direction.

In the piezoelectric vibrating piece and the method of fabricating the piezoelectric vibrating piece according to the invention, the pair of vibrating arm portions are respectively formed with the through holes, and therefore, when drive voltage is applied thereto, the field efficiency between the pair of exciting electrodes can maximally be increased. Therefore, the vibration loss can effectively be restrained and the vibration property can be made to far excellent. Therefore, the CI value (Crystal Impedance) and the resonance frequency can sufficiently be made to be low and further high function formation of the piezoelectric vibrating piece can be achieved.

Further, according to the piezoelectric vibrating piece of the invention, in the above-described piezoelectric vibrating piece of the invention, a side face of the vibrating arm portion is formed with a reinforcing portion of being projected in a width direction of the vibrating arm portion over at least a region of forming a through hole.

Further, according to the method of fabricating the piezoelectric vibrating piece of the invention, in the above-described method of fabricating the piezoelectric vibrating piece of the invention, in the outer shape forming step, a side face of the vibrating arm portion is formed with a reinforcing portion projected in a width direction of the vibrating arm portion over at least a region of forming the through hole.

In the piezoelectric vibrating piece and the method of fabricating the piezoelectric vibrating piece according to the invention, the side face of the vibrating arm portion is formed with the reinforcing portion projected in the width direction of the vibrating arm portion, and therefore, even when the through hole is formed at the vibrating arm portion, a reduction in a rigidity by the through hole can be compensated for. Particularly, the reinforcing portion is formed over at least a region of forming the through hole, and therefore, the portion the width of which is narrowed by the through hole can be reinforced. Therefore, the pair of vibrating arm portions can be vibrated without bringing about bending, deformation or the like.

Further, a piezoelectric vibrator according to the invention includes the piezoelectric vibrating piece of the invention.

In the piezoelectric vibrator according to the invention, the above-described piezoelectric vibrating piece is provided, and therefore, small-sized formation can be achieved by shortening the total length more than that of the background art and needs for small-sized formation can be dealt with. Further, the piezoelectric vibrating piece sufficiently reducing vibration leakage is constituted, and therefore, the high quality piezoelectric vibrator promoting a reliability can be constituted.

Further, the piezoelectric vibrator according to the invention further comprises a base board of mounting the piezoelectric vibrating piece at an upper face thereof, a lid board bonded to the base board in a state of containing the mounted piezoelectric vibrating piece at inside of a cavity, and a pair of outer electrodes formed on a lower face of the base board and respectively electrically connected to a pair of mount electrodes of the mounted piezoelectric vibrating piece in the above-described piezoelectric vibrator of the invention.

In the piezoelectric vibrator of the invention, the piezoelectric vibrating piece is contained at inside of the cavity formed between the base board and the lid board bonded to each other. At this occasion, the piezoelectric vibrating piece is mounted on the upper face of the base board in a state of being electrically connected to the pair of outer electrodes. Thereby, by applying the drive voltage to the pair of outer electrodes, a voltage can be applied at the pair of mount electrodes, and therefore, a pair of vibrating arm portions can be vibrated.

Particularly, the piezoelectric vibrator of the package type of the surface mounting type hermetically closing the piezoelectric vibrating piece at inside of the cavity can be constituted, and therefore, the piezoelectric vibrating piece can be vibrated without being influenced by dust and dirt or the like, the piezoelectric vibrating piece can further accurately can further accurately be vibrated. In addition thereto, owing to the surface mounting type, mounting can easily be carried out and stability after mounting is excellent.

Further, the piezoelectric vibrator according to the invention further comprises a case of containing the piezoelectric vibrating piece at inside thereof; and an airtight terminal including a stem formed in a ring-like shape and press-fit to be fixed to inside of the case, two pieces of lead terminals which are arranged in a state of penetrating the stem, one end sides of which are made to constitute inner leads respectively electrically connected to the pair of mount electrodes by interposing the stem therebetween, and other end sides of which are made to constitute outer leads respectively electrically connected to outside, and a filing member of fixing the lead terminal and the stem for hermetically closing inside of the case in the above-described piezoelectric vibrator of the invention.

In the piezoelectric vibrator according to the invention, the piezoelectric piece is contained at inside of the case hermetically closed by the airtight terminal. At this occasion, according to the piezoelectric vibrating piece, the pair of mount electrodes are mounted to the lead terminals in a state of being electrically connected to the inner leads of 2 pieces of the lead terminals. Thereby, by applying the drive voltage to the outer leads of 2 pieces of the lead terminals, the voltage can be applied to the pair of mount electrodes, and therefore, the pair of vibrating arm portions can be vibrated.

Particularly, the piezoelectric vibrator of the cylinder package type hermetically closing the piezoelectric vibrating piece at inside of the case can be constituted, and therefore, the piezoelectric vibrating piece can be vibrated without being influenced by dust and dirt or the like, and the piezoelectric vibrating piece can further accurately be vibrated.

Further, according to an oscillator of the invention, the piezoelectric vibrator is electrically connected to an integrated circuit as an oscillating piece.

Further, according to an electronic apparatus of the invention, the piezoelectric vibrator is electrically connected to a time counting portion.

Further, according to a radiowave timepiece of the invention, a piezoelectric vibrator is electrically connected to a filter portion.

In the oscillator, the electronic apparatus and the radiowave timepiece according to the invention, the above-described piezoelectric vibrator is provided, and therefore, small-sized formation can similarly be achieved and promotion of reliability and high quality formation can be achieved.

According to the piezoelectric vibrating piece and the method of fabricating the piezoelectric vibrating piece of the invention, small-sized formation can be achieved by shortening the total length after ensuring the length of the base portion capable of sufficiently reducing vibration leakage.

Further, according to the piezoelectric vibrator, the oscillator, the electronic timepiece and the radiowave timepiece according to the invention, the above-described piezoelectric vibrating piece is provided, and therefore, small-sized formation can similarly be achieved and promotion or reliability and high quality formation can be achieved.

BRIEF DESCRIPTION OF THE DRAWINGS

FIG. 19 is a view showing a movement of a pair of vibrating arm portions when the piezoelectric vibrator shown in FIG. 1 is operated;

DETAILED DESCRIPTION OF THE PREFERRED EMBODIMENTS

An embodiment according to the invention will be explained in reference to FIG. 1 through FIG. 19 as follows. Further, according to the embodiment, an explanation will be given by taking an example of a piezoelectric vibrator of a glass package type of a surface mounting type.

As shown by FIG. 1 through FIG. 4, a piezoelectric vibrator 1 of the embodiment is a piezoelectric vibrator which is formed in a shape of a box laminated in two layers by a base board 3 and a lid board 4 and in which a piezoelectric vibrating piece 2 is contained at inside of a cavity C at an inner portion thereof.

Figure 4:
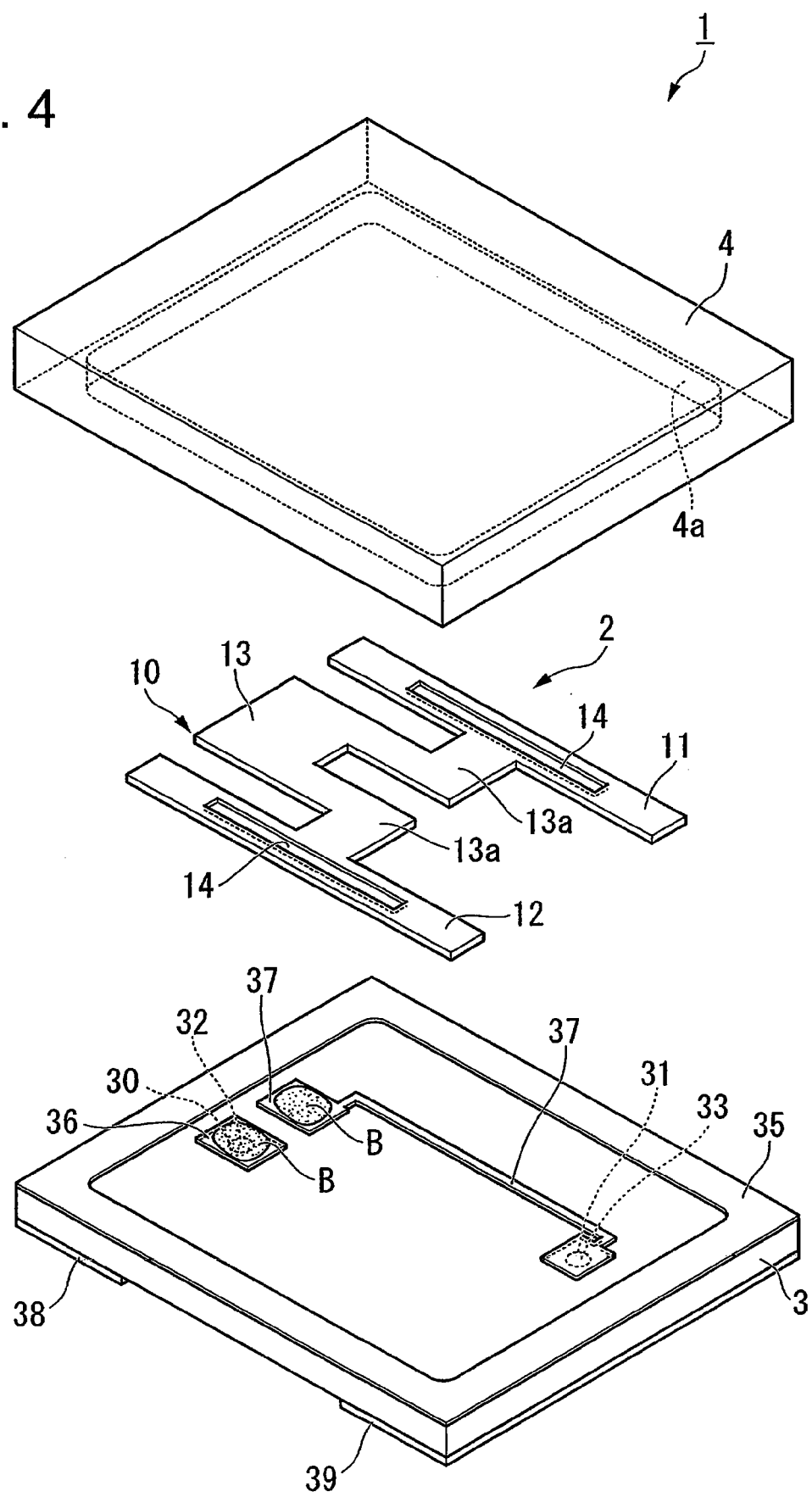
FIG. 4 is a disassembled perspective view of the piezoelectric vibrator shown in FIG. 1.

Further, in FIG. 4, illustration of exciting electrodes 20, 21, leadout electrodes 24, 25, mount electrodes 22, 23 mentioned later is omitted to facilitate to view the drawing.

Figure 5:
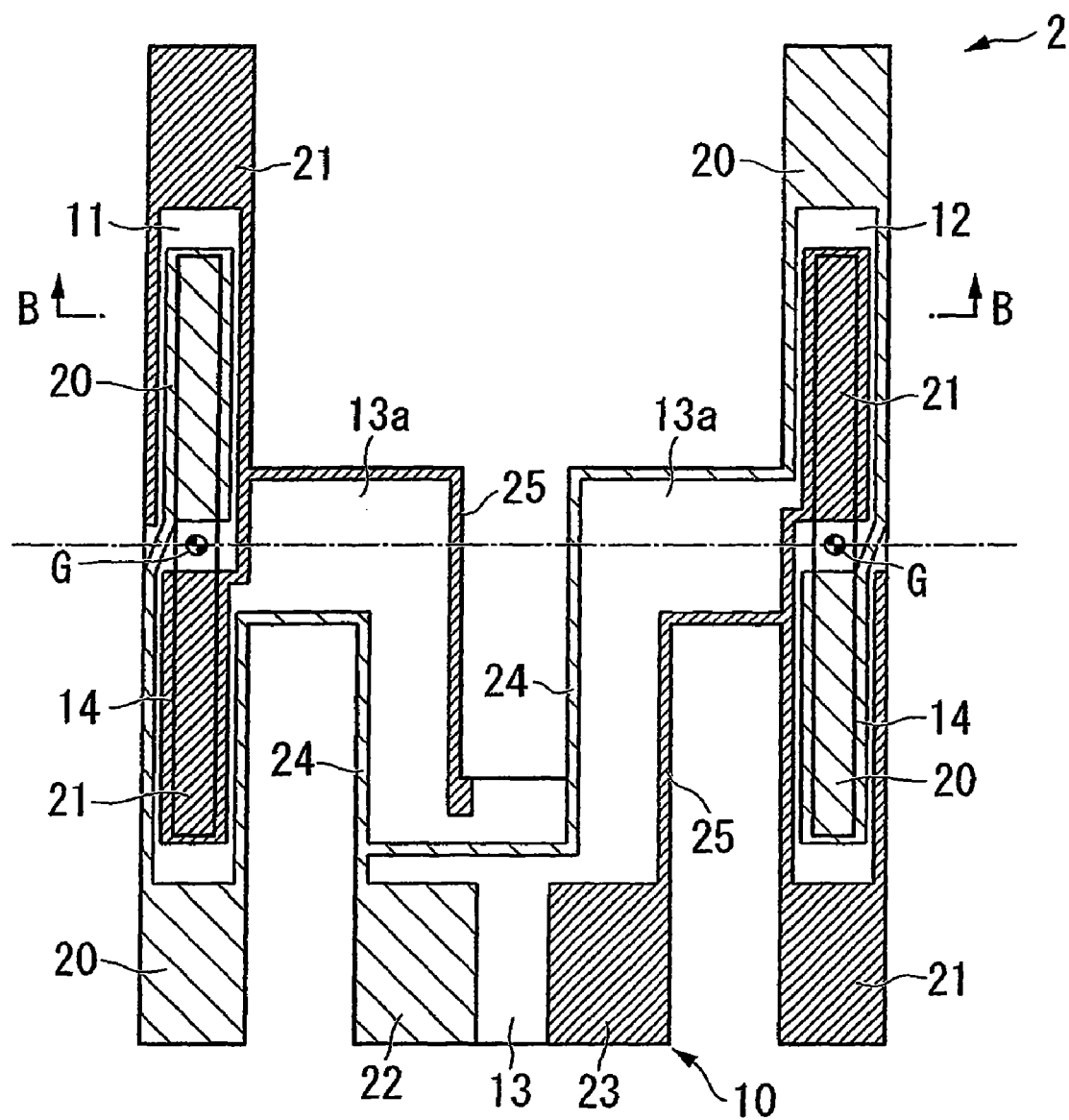
FIG. 5 is a view viewing a piezoelectric vibrating piece constituting the piezoelectric vibrator shown in FIG. 1 from an upper face.
Figure 6:
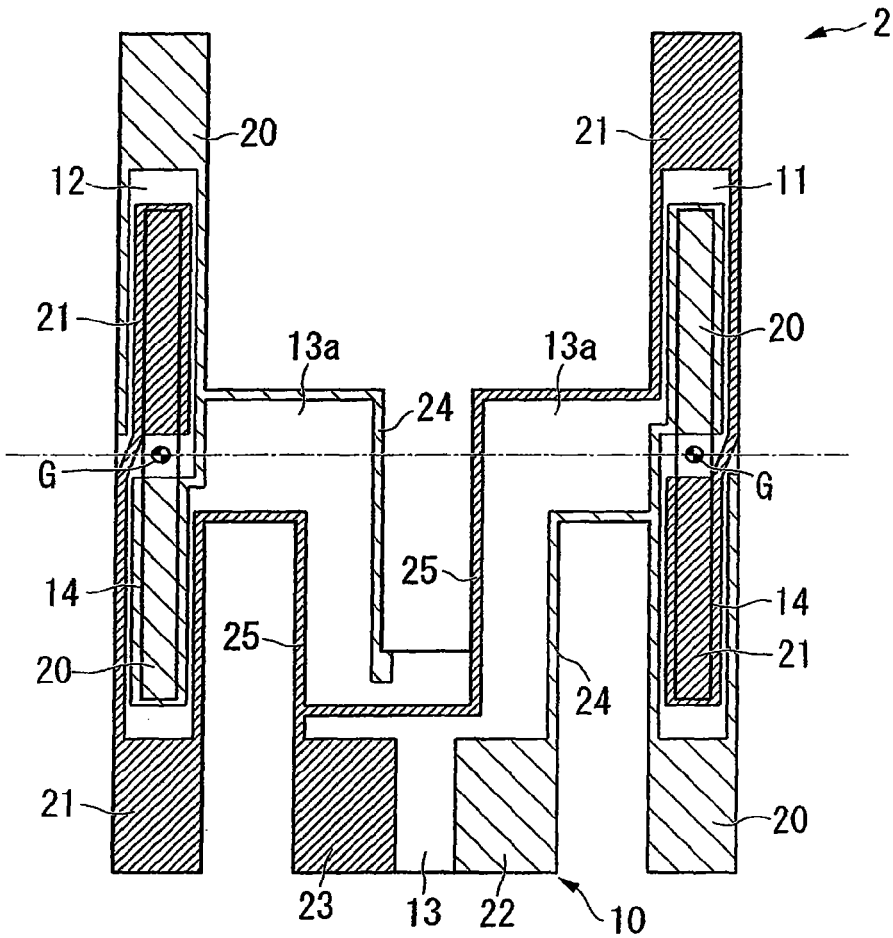
FIG. 6 is a view viewing the piezoelectric vibrating piece shown in FIG. 5 from a lower face.
Figure 7:
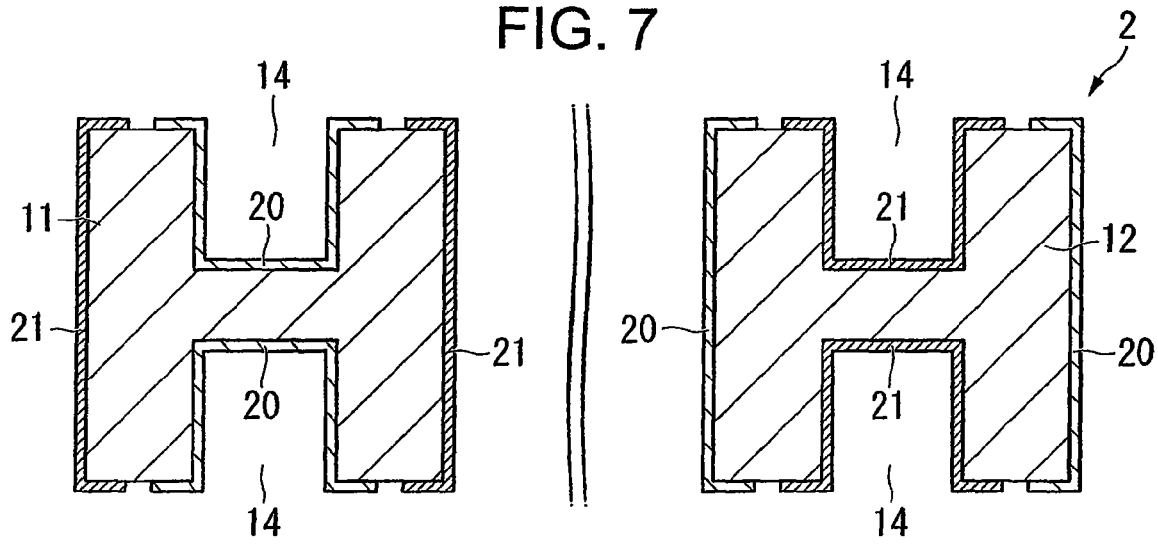
FIG. 7 is a view taken along a line B-B shown in FIG. 5.

As shown by FIG. 5 through FIG. 7, the piezoelectric vibrating piece 2 includes a piezoelectric plate 10 of a tuning fork type formed by a piezoelectric material of quartz, lithium tantalate, lithium niobate or the like.

The piezoelectric plate 10 includes a pair of vibrating arm portions 11, 12 arranged in parallel with each other in a state of being extended in one direction from base ends to front ends, and a base portion 13 having connecting portions 13a respectively connected to the pair of vibrating arm portions 11, 12 at middle portions from the base ends to the front ends, and integrated for supporting the pair of vibrating arm portions 11, 12 by way of the connecting portions 13a.

Both of the pair of vibrating arm portions 11, 12 are formed by uniform thicknesses and widths from the base ends to the front ends and centers in length directions are made to constitute gravitational enter positions G. Further, the connecting portions 13a are connected to the vibrating arm portions 11, 12 at the gravitational center positions G. The connecting portion 13a is connected to a front end side of the base portion 13 after being folded to bend substantially by 90 degrees at the middle.

At least portions of the base portion 13 are arranged to be interposed between the pair of vibrating arm portions 11, 12. Further, according to the embodiment, an example is taken by a case of designing such that a total of the base portion 13 is arranged to be interposed between the pair of vibrating arm portions 11, 12 and a base end side of the base portion 13 does not jump out from base end sides of the vibrating arm portions 11, 12. Thereby, a total length of the piezoelectric vibrating piece 2 is constituted by a length of the vibrating arm portions 11, 12 without being influenced by the length of the base portion 13.

Further, both faces of the pair of vibrating arm portions 11, 12 in the embodiment are respectively formed with groove portions 14 along a length direction. The groove portions 14 are formed to extend to base ends and front ends of the vibrating arm portions 11, 12 by the same length centering on the gravitational positions G.

As shown by FIG. 7, the pair of vibrating arm portions 11, 12 are constituted by sections in H shape by the groove portions 14.

As shown by FIG. 5 through FIG. 7, the pair of exciting electrodes 20, 21 and the pair of mount electrodes 22, 23 are formed on outer surface of the piezoelectric plate 10 formed in this way by patterning an electrode film. The pair of exciting electrodes 20, 21 are electrodes of vibrating the pair of vibrating arm portions 11, 12 when a drive voltage is applied thereto, and are formed on outer surfaces of the pair of vibrating arm portions 11, 12 in a state of being electrically cut to separate from each other.

Specifically, on front end sides of the vibrating arm portions 11, 12, the exciting electrodes 20 on one side are mainly formed on the groove portion 14 of the vibrating arm portion 11 on one side and on two side faces of the vibrating arm portion 12 on other side, and the exciting electrodes 21 on other side are mainly formed on two side faces of the vibrating arm portion 11 on one side and on the groove portion 14 of the vibrating arm portion 12 on other side.

Further, the pair of exciting electrodes 20, 21 of the embodiment are patterned such that polarities are reversed by base end sides and front end sides of the vibrating arm portions 11, 12 by constituting boundaries by the connecting portions 13a. Therefore, on base end sides of the vibrating arm portions 11, 12, the exciting electrode 20 on one side is mainly formed on the two side faces of the vibrating arm portion 11 on one side and the groove portion 14 of the vibrating arm portion 12 on other side and the exciting electrode 21 on other side is mainly formed on the groove portion 14 of the vibrating arm portion 11 on one side and two side faces of the vibrating arm portion 12 on other side.

The pair of mount electrodes 22, 23 are formed on an outer surface of the base portion 13, are respectively electrically connected to the pair of exciting electrodes 20, 21 by way of the readout electrodes 24, 25 mainly formed on an outer surface of the connecting portion 13a. Further, the pair of exciting electrodes 20, 21 are applied with a drive voltage by way of the mount electrodes 22, 23.

Further, the exciting electrodes 20, 21, and the leadout electrodes 24, 25 and the mount electrodes 22, 23 mentioned above are, for example, laminated films of chromium (Cr), gold (Au) and formed by constituting a matrix by a chromium film having an excellent adherence with quartz, thereafter, applied with a thin film of gold on the surface. However, the invention is not limited to the case, for example, a surface of a laminated film of chromium and nichrome (NiCr) may be laminated with a thin film of gold, or a single layer film of chromium, nickel, aluminum (Al), titanium (Ti) or the like will do.

Further, front ends of the pair of vibrating arm portions 11, 12 are formed with weight metal films (including rough adjusting films and fine adjusting films), not illustrated, for carrying out an adjustment (frequency adjustment) of vibrating states of their own to vibrate within predetermined ranges of frequencies. By carrying out frequency adjustment by utilizing the weight metal films, the frequencies of the pair of vibrating arm portions 11, 12 can be confined within a range of a nominal frequency of a device.

Figure 2:
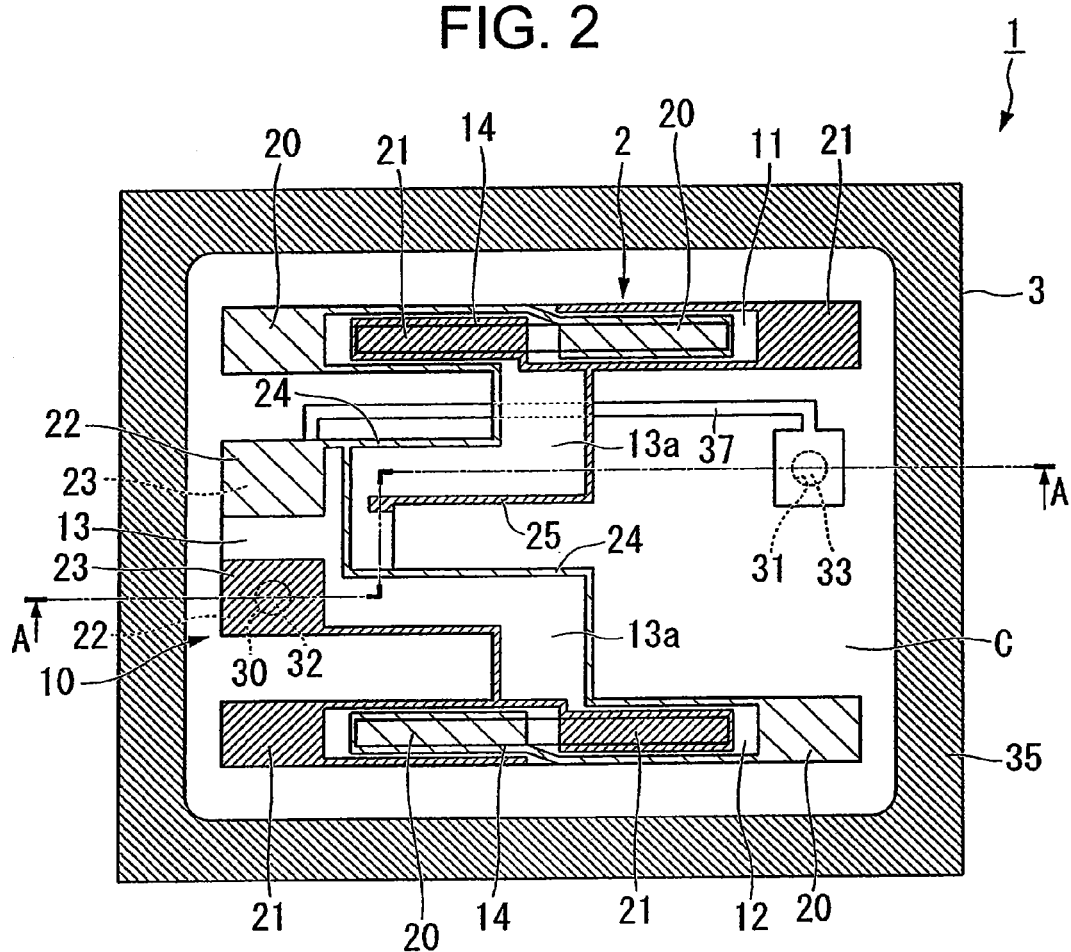
FIG. 2 is a constitution view of an inner portion of the piezoelectric vibrator shown in FIG. 1 and is a view viewing a piezoelectric vibrating piece from an upper side in a state of removing a lid board.
Figure 3:
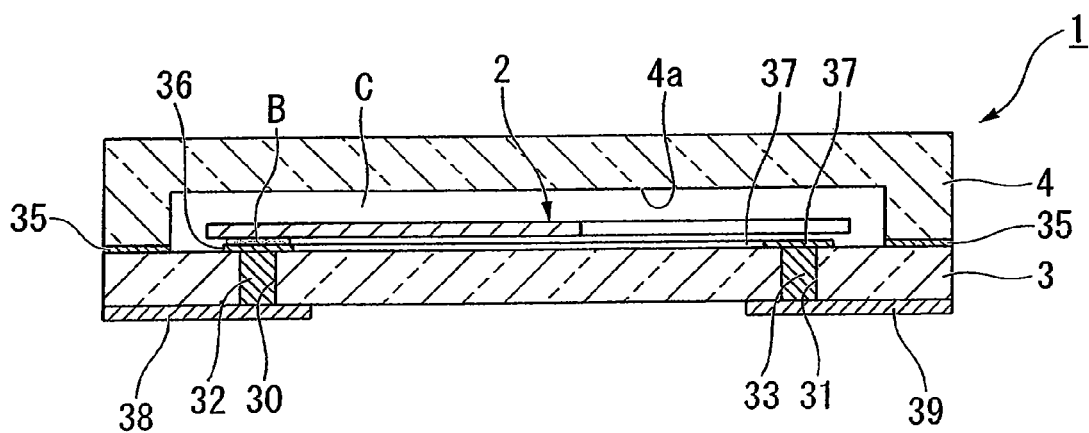
FIG. 3 is a sectional view of the piezoelectric vibrator taken along a line A-A shown in FIG. 2.

As shown by FIG. 2 through FIG. 4, the piezoelectric vibrating piece 2 constituted in this way is mounted on an upper face of the base board 3 by bump bonding by utilizing a bump B of a gold or the like. Further specifically, bump bonding is carried out in a state of bringing the pair of mount electrodes 22, 23 respectively into contact with the two bumps B formed on leadaround electrodes 36, 37, mentioned later patterned on the upper face of the base board 3. Thereby, the piezoelectric vibrating piece 2 is supported in a state of being floated from the upper face of the base board 3 and the mount electrodes 22, 23 and the leadaround electrodes 36, 37 are brought into a state of being electrically connected to each other.

Figure 1:
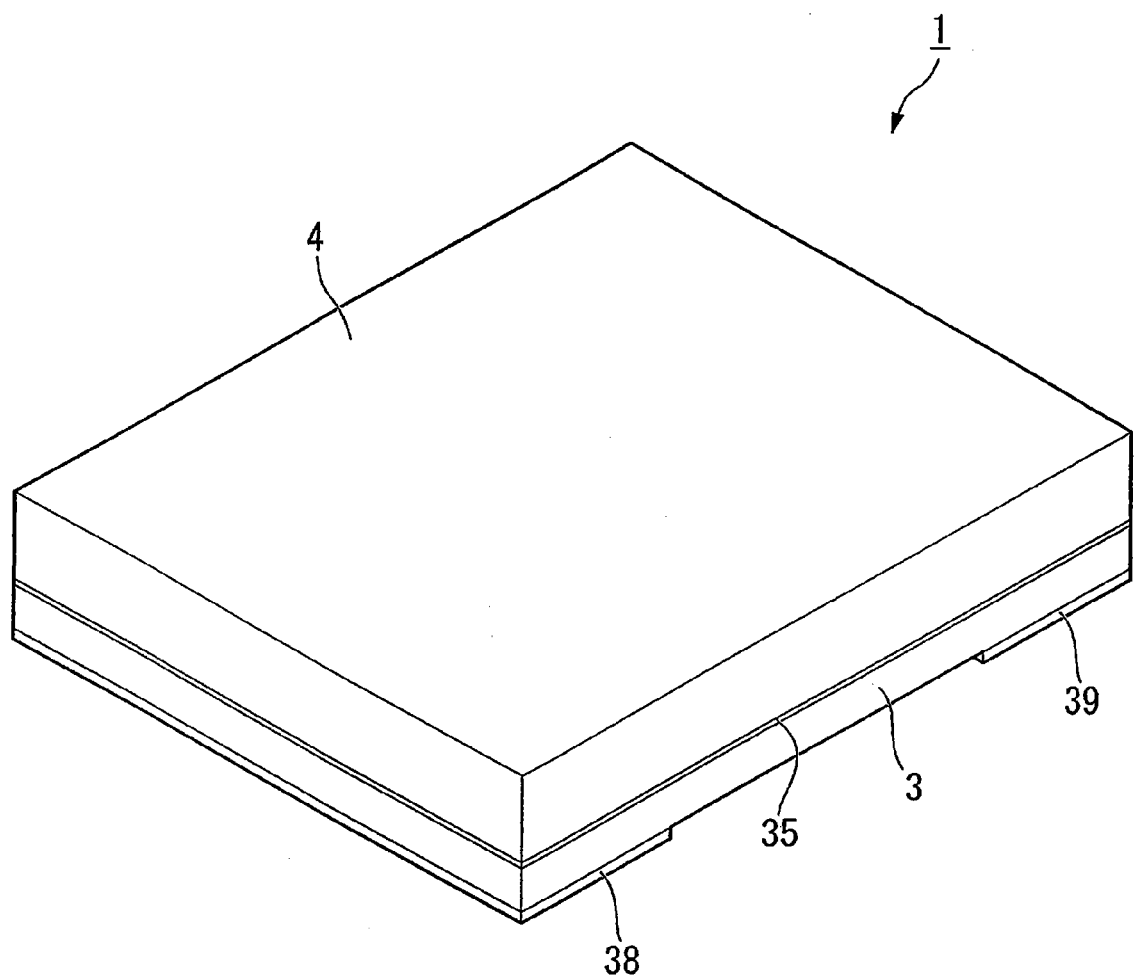
FIG. 1 is a perspective view of an outlook showing an embodiment of a piezoelectric vibrator according to the invention.

The lid board 4 is a transparent insulating board made of a glass material, for example, soda-lime glass and is formed in a shape of a plate as shown by FIG. 1, FIG. 3 and FIG. 4. Further, a side of a bonding face thereof to be bonded with the base board 3 is formed with a recess portion 4a in a rectangular shape of containing the piezoelectric vibrating piece 2. The recess portion 4a is a recess portion for a cavity constituting the cavity C of containing the piezoelectric vibrating piece 2 when the two boards 3, 4 are overlapped. Further, the lid board 4 is anodically bonded to the base board 3 in a state of making the recess portion 4a opposed to a side of the base board 3.

The base board 3 is a transparent insulating board made of a glass material, for example, soda-lime glass similar to the lid board 4, and is formed in a shape of a plate by a size capable of being overlapped to the lid board 4 as shown by FIG. 1 through FIG. 4.

The base board 3 is formed with a pair of through holes 30, 31 penetrating the base board 3. At this occasion, the pair of through holes 30, 31 are formed to be contained at inside of the cavity C. Explaining further in details, the pair of through holes 30, 31 are formed such that the through hole 30 on one side is disposed on a side of the base portion 13 of the mounted piezoelectric vibrating piece 2 and the through holes 31 on other side is disposed on front end sides of the vibrating arm portions 11, 12.

Further, although according to the embodiment, an explanation will be given by taking an example of the through holes 30, 31 penetrating straight the base board 3, the embodiment is not limited to the case but the through holes may be formed in, for example, a taper shape of contracting a diameter gradually to a lower face of the base board 3. At any rate, the through holes may be penetrated through the base board 3.

Further, the pair of through holes 30, 31 are formed with a pair of through electrodes 32, 33 formed to embed the through holes 30, 31. The through electrodes 32, 33 serve to maintain an air tightness inside of the cavity C completely closing the through holes 30, 31 and conduct outer electrodes 38, 39 mentioned later and the leadaround electrodes 36, 37.

The upper side of the base board 3 (side of bonding face fitted with lid board 4) is patterned with a bonding film 35 for anodic bonding and the pair of leadaround electrodes 36, 37 by a conductive material (for example, aluminum). The bonding film 35 thereamong is formed along a peripheral edge of the base board 3 to surround a surrounding of the recess portion 4a formed at the lid board 4.

Further, the pair of leadaround electrodes 36, 37 are patterned to electrically connect the through electrodes 32 on one side and the mount electrode 22 on one side of the piezoelectric vibrating piece 2 and electrically connect the through electrode 33 on other side and the mount electrode 23 on the side of the piezoelectric vibrating piece 2 in the pair of through electrodes 32, 33.

Explaining further in details, as shown in FIG. 2 through FIG. 4, the leadaround electrode 36 on one side is formed right above the through electrodes 32 on one side to be disposed right below the base portion 13 of the piezoelectric vibrating piece 2. Further, the leadaround electrode 37 on other side is formed to be disposed right above the through electrode 33 on other side after being led around to front end sides of the vibrating arm portions 11, 12 along the vibrating arm portions 11, 12.

Further, the bumps B are formed on the pair of leadaround electrodes 36, 37 and the piezoelectric vibrating piece 2 is mounted by utilizing the bumps B. Thereby, the mount electrode 22 on one side of the piezoelectric vibrating piece 2 is conducted to the through electrode 32 on one side by way of the leadaround electrode 36 on one side and the mount electrode 23 on other side is conducted to the through electrode 33 on other side by way of the leadaround electrode 37 on other side.

Further, as shown by FIG. 1, FIG. 3 and FIG. 4, a lower face of the base board 3 is formed with the outer electrodes 38, 39 respectively electrically connected to the pair of through electrodes 32, 33. That is, the outer electrode 38 on one side is electrically connected to the mount electrode 22 on one side of the piezoelectric vibrating piece 2 by way of the through electrode 32 on one side and the leadaround electrode 36 on one side. Further, the external electrode 39 on other side is electrically connected to the mount electrode 23 on other side of the piezoelectric vibrating piece 2 by way of the through electrode 33 on other side and the leadaround electrode 37 on other side.

Figure 8:
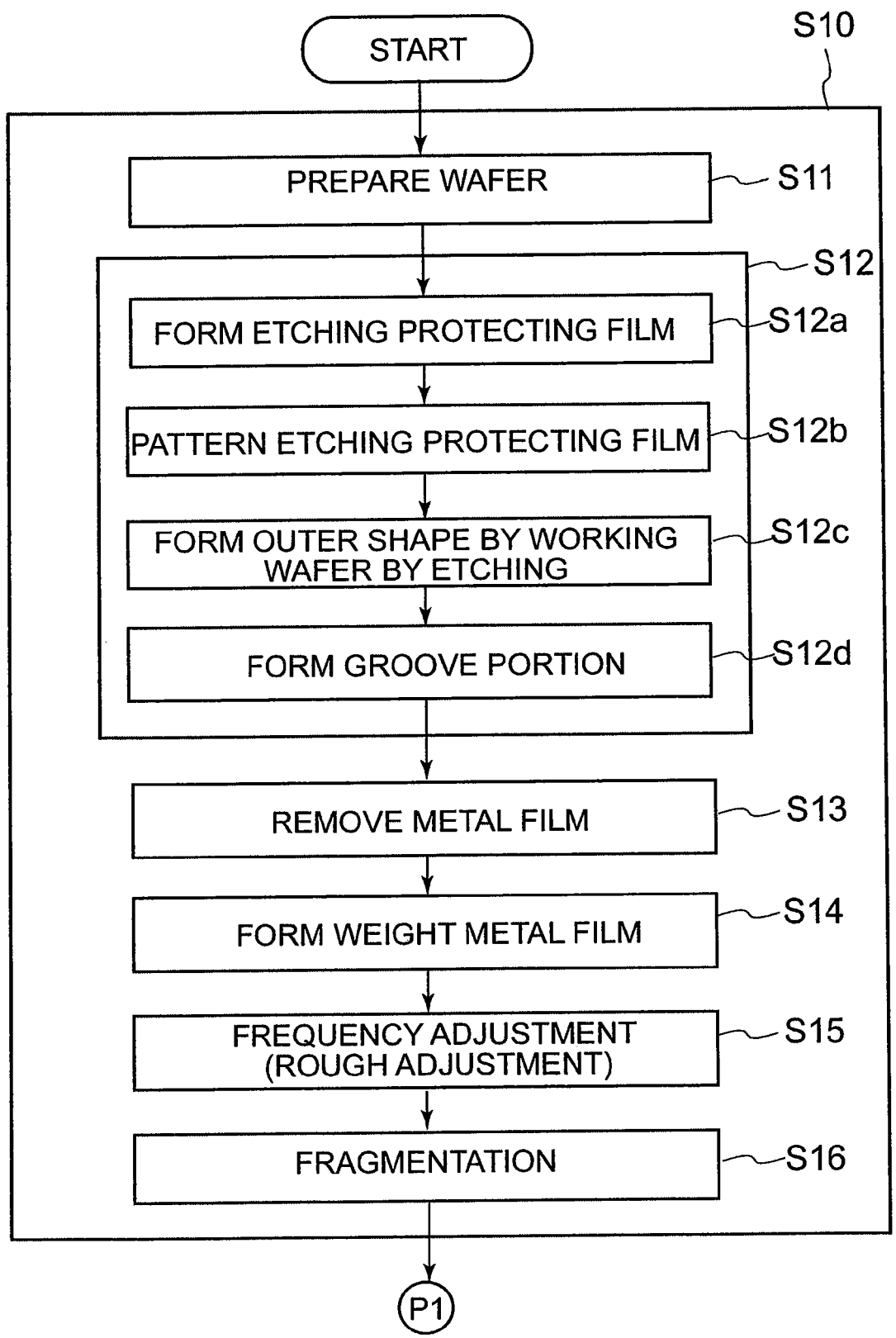
FIG. 8 is a flowchart in fabricating the piezoelectric vibrator shown in FIG. 1.

Next, a method of fabricating the piezoelectric vibrating piece 2 as well as the piezoelectric vibrator 1 mentioned above will be explained as follows in reference to a flowchart shown in FIG. 8 and FIG. 9.

First, there is carried out a piezoelectric vibrating piece fabricating step of fabricating a plurality of the piezoelectric vibrating pieces 2 shown in FIG. 5 through FIG. 7 at a time utilizing the wafer S made of the piezoelectric material (S10).

In carrying out the step, first, the wafer S finished with polishing and finished highly accurately to a predetermined thickness is prepared (S11). Successively, there is carried out an outer shape forming step of forming the shapes of the plurality of piezoelectric plates 10 at the wafer S by etching the wafer S by a photolithography technology (S12). The step will be explained specifically.

Figure 10:
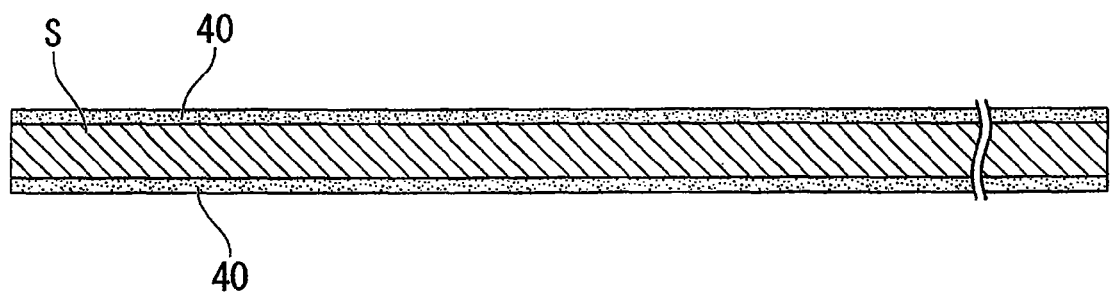
FIG. 10 is a view showing one step in fabricating the piezoelectric vibrator shown in FIG. 1 and is a view showing a state of forming etching protecting films on both faces of the wafer.
Figure 11:
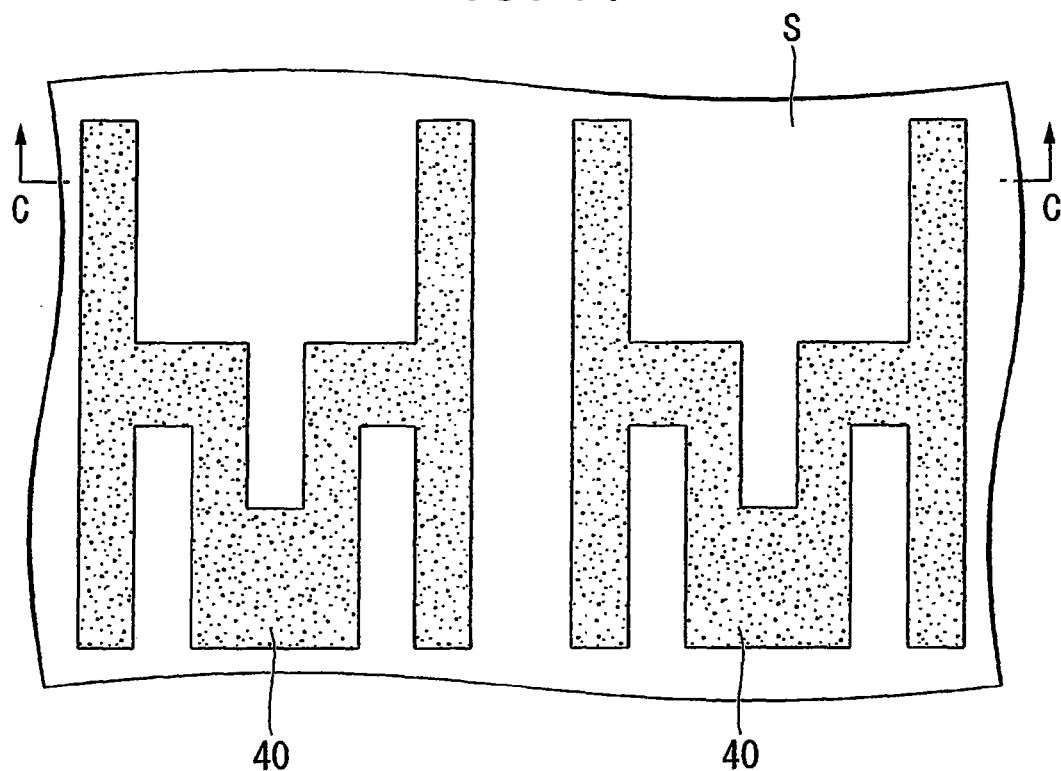
FIG. 11 is a view showing a state of patterning the etching protecting film to an outer shape of a piezoelectric plate of a piezoelectric vibrating piece from the state shown in FIG. 10.
Figure 12:
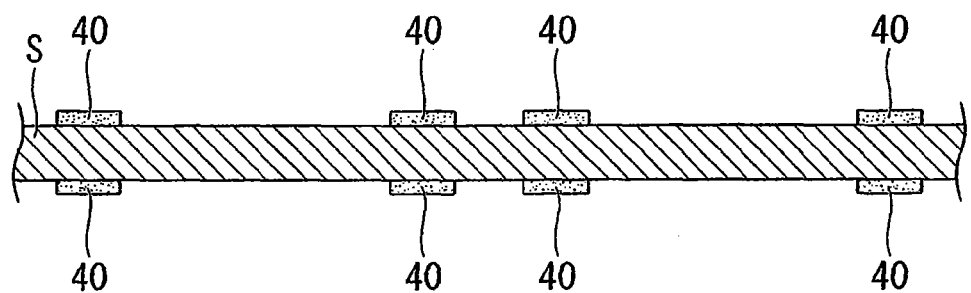
FIG. 12 is a view taken along a line C-C shown in FIG. 11.

First, as shown by FIG. 10, etching protecting films 40 are respectively formed on both faces of the wafer S (S12a). As the etching protecting film 40, for example, chromium (Cr) is formed by several μm. Next, a photoresist film, not illustrated, is patterned on the etching protecting film 40 by a photolithography technology. At this occasion, patterning is carried out to surround a surrounding of the piezoelectric plate 10 constituted by the pair of vibrating arm portions 11, 12 and the base portion 13 having the connecting portion 13a. Further, etching is carried out by constituting a mask by the photoresist film and the etching protecting film 40 which is not masked is selectively removed. Further, the photoresist film is removed after the etching. Thereby, as shown by FIG. 11 and FIG. 12, the etching protecting film 40 can be patterned along an outer shape of the piezoelectric plate 10, that is, outer shapes of the pair of vibrating arm portions 11, 12, the connecting portion 13a and the base portion 13 (S12b). At this occasion, patterning is carried out by a number of the plurality of piezoelectric plates 10.

Further, FIG. 12 through FIG. 15 are views showing a section along a cut line C-C shown in FIG. 11.

Figure 13:
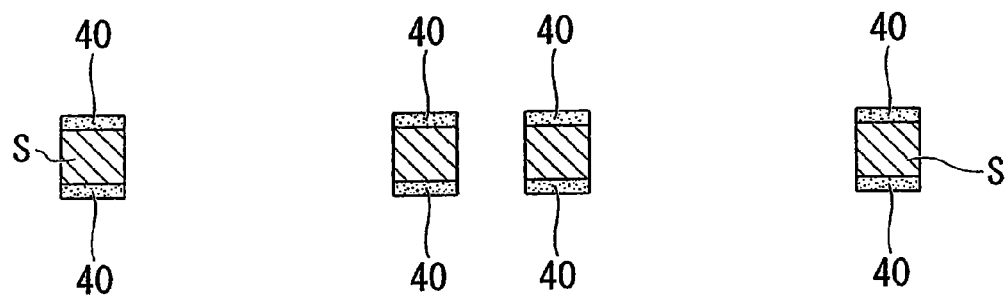
FIG. 13 is a view showing a state of working a wafer by etching by constituting a mask by the etching protecting film from a state shown in FIG. 12.

Next, both faces of the wafer S are respectively etched by constituting a mask by the patterned etching protecting film 40 (S12c). Thereby, as shown by FIG. 13, an outer shape of the piezoelectric plate 10 can be formed by selectively removing a region of the etching protecting film 40 which is not masked.

Figure 14:
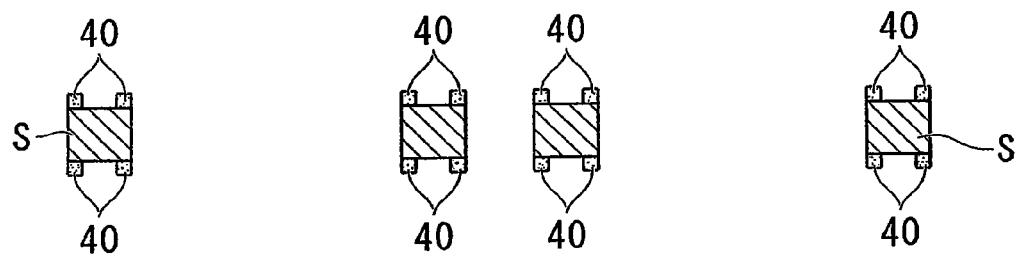
FIG. 14 is a view showing a state of further patterning the etching protecting film from the state shown in FIG. 13.

Successively, according to the embodiment, before carrying out an electrode forming step, there is a carried out a groove portion forming step of forming the groove portions 14 at the pair of vibrating arm portions 11, 12 (S12d). Specifically, a photoresist film, not illustrated, is formed on the etching protecting film 40 similarly in forming the outer shape as described above. Further, the photoresist film is patterned to open a region of the groove portion 14 by a photolithography technology. Further, the etching protecting film 40 is selectively removed by carrying out etching by constituting a mask by the patterned photoresist film. Thereafter, as shown by FIG. 14, the etching protecting film 40 patterned already can further be patterned in a state of constituting the region of the groove portion 14.

Figure 15:
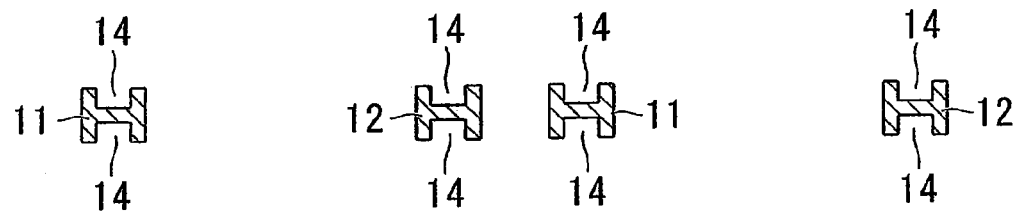
FIG. 15 is a view showing a state of working a wafer by etching by constituting a mask by the etching protecting film patterned again.

Next, the wafer S is etched by constituting the mask by the etching protecting film 40 patterned again, thereafter, the etching protecting film 40 constituting the mask is removed. Thereby, as shown by FIG. 15, the groove portions 14 can respectively be formed on the both faces of the pair of vibrating arm portions 11, 12.

The outer shape forming step is finished at the time point. Further, a plurality of piezoelectric plates 10 are brought into a state of being connected to the wafer S by way of a connecting portion, not illustrated, until carrying out a cutting step carried out later.

Next, there is carried out an electrode forming step of respectively forming the exciting electrodes 20, 21, the read-out electrodes 24, 25, the mount electrodes 22, 23 by forming the electrode film on the outer surfaces of the plurality of piezoelectric plates 10 and carrying out patterning (S13). Further, the weight metal film is formed by a similar method simultaneously therewith (S14). Particularly in carrying out the electrode forming step, the pair of exciting electrodes 20, 21 are formed such that polarities are reversed between base end sides and front end sides of the vibrating arm portions 11, 12 by constituting the boundary by the connecting portion 13a.

Next, rough adjustment of a resonance frequency is carried out (S15). This is carried out by changing a weight by irradiating laser light to the rough adjusting film of the weight metal film to partially evaporate. Further, fine adjustment of adjusting the resonance frequency further highly accurately will be carried out later. An explanation thereof will be given later.

Further, finally, there is a carried out a cutting step of cutting to separate the plurality of piezoelectric plates 10 from the wafer S to fragment by cutting the connecting portion of connecting the wafer S and the piezoelectric plate 10 (S16). Thereby, a plurality of the piezoelectric pieces 2 of the tuning fork type can be fabricated at a time from the single wafer S. At the time point, the step of fabricating the piezoelectric piece 2 is finished.

Next, there is carried out a first wafer fabricating step of fabricating a wafer 45 for a board to constitute the lid board 4 later until a state immediately before carrying out anodic bonding (S20).

Figure 16:
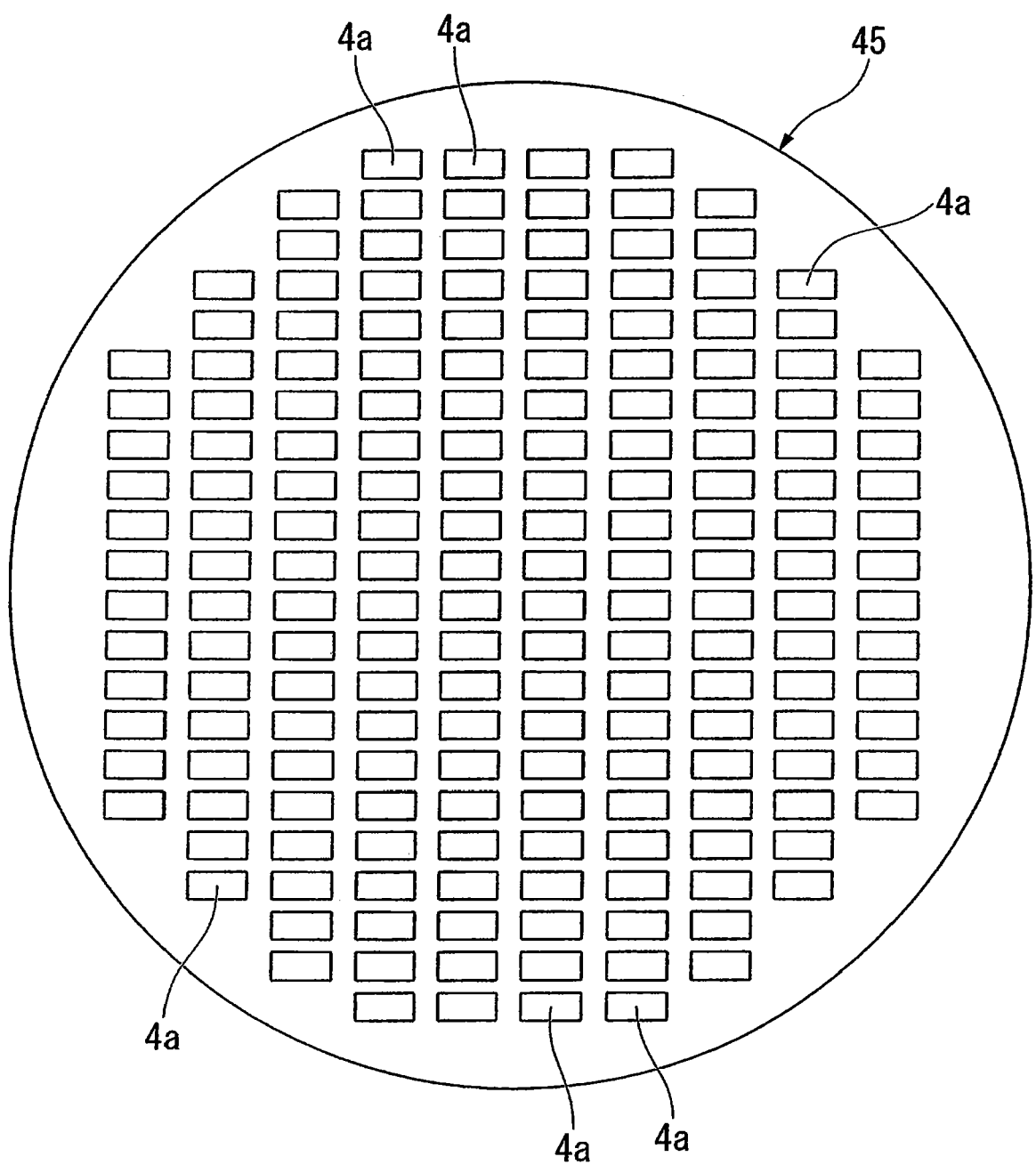
FIG. 16 is a view showing one step in fabricating the piezoelectric vibrator shown in FIG. 1 and is a view showing a state of forming a plurality of recess portions at the wafer for a lid board constituting a base of the lid board.

First, after polishing to clean soda-lime glass to a predetermined thickness, as shown by FIG. 16, the wafer 45 for a lid board in a shape of a circular plate removing a work denatured layer of an outermost surface by etching or the like is formed (S21). Successively, there is carried out a recess portion forming step of forming a plurality of the recess portions 4a of the cavities C in row and column directions by etching or the like at a bonding face of the wafer 45 for the lid board (S22). At the time point, the first wafer fabricating step is finished.

Next, there is carried out a second wafer forming step of forming a wafer 46 for a base board to constitute the base board 3 to a state immediately before carrying out anodic bonding by a timing simultaneously or before or after the step (S30).

Figure 17:
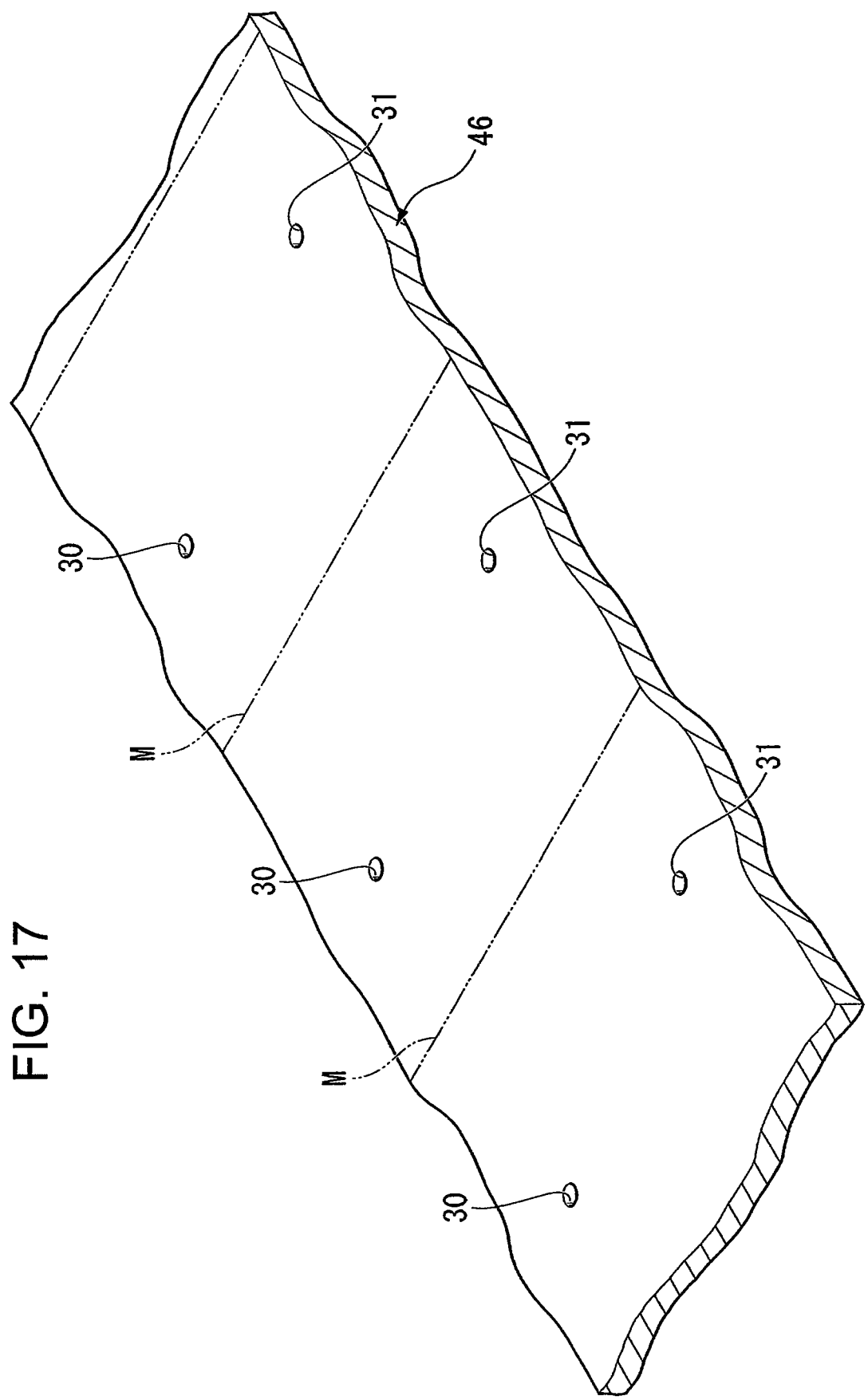
FIG. 17 is a view showing one step in fabricating the piezoelectric vibrator shown in FIG. 1 and is a view showing a state of forming a pair of through holes at a wafer for a base board constituting a base of the base board.

First, after polishing to clean soda-lime glass to a predetermined thickness, the wafer 46 for the base board in a shape of a circular plate removing the work denatured layer of the outermost surface by etching or the like is formed (S31). Next, as shown by FIG. 17, there is carried out a through hole forming step of forming a plurality of pairs of through holes 30, 31 penetrating the wafer 46 of the base board (S32). Further, a dotted line M shown in FIG. 17 illustrates a cut line cut at a cutting step carried out later.

At this occasion, the plurality of pairs of through holes 30, 31 are formed to be contained in the recess portions 4a formed at the wafer 45 for the lid board when the two wafers 45, 46 are overlapped later. Further, the through holes are formed such that the through hole 30 on one side is disposed on a side of the base portion 13 of the piezoelectric vibrating piece 2 to be mounted and the through hole 31 on other side is disposed on front end sides of the vibrating arm portions 11, 12.

Successively, there is carried out a through electrode forming step of forming the pair of through electrodes 32, 33 by embedding the plurality of through holes 30, 31 by a conductive member, not illustrated (S33).

Figure 18:
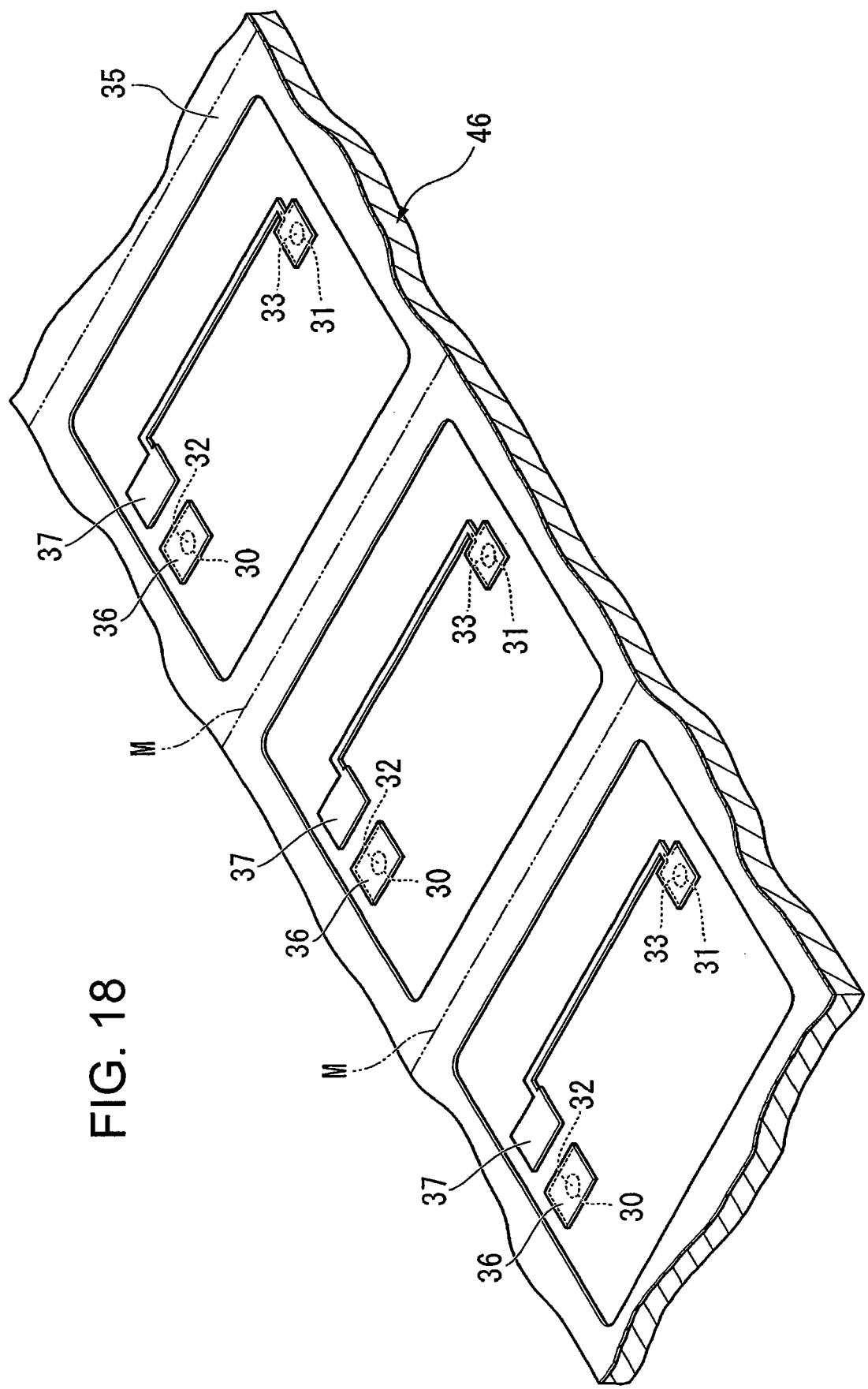
FIG. 18 is a view showing a state of forming through electrodes into the pair of through holes and patterning a bonding film and a leadaround electrode at an upper face of the wafer for the base board after the state shown in FIG. 17.

Successively, there is carried out a bonding film forming step of forming the bonding film 35 as shown by FIG. 18 by patterning a conductive material to the upper face of the wafer 46 for the base board (S34) and there is carried out a leadaround electrode forming step of forming a plurality of the leadaround electrodes 36, 37 electrically connected to the pair of through electrodes 32, 33 (S35). Further, a dotted line M shown in FIG. 18 illustrates a cut line cut by the cutting step carried out later.

By carrying out the step, there is brought about a state of conducting the through electrode 32 on one side and the leadaround electrode 36 on one side and conducting the through electrode 33 on other side and the leadaround electrode 37 on other side. At the time point, the second wafer fabricating step is finished.

Figure 9:
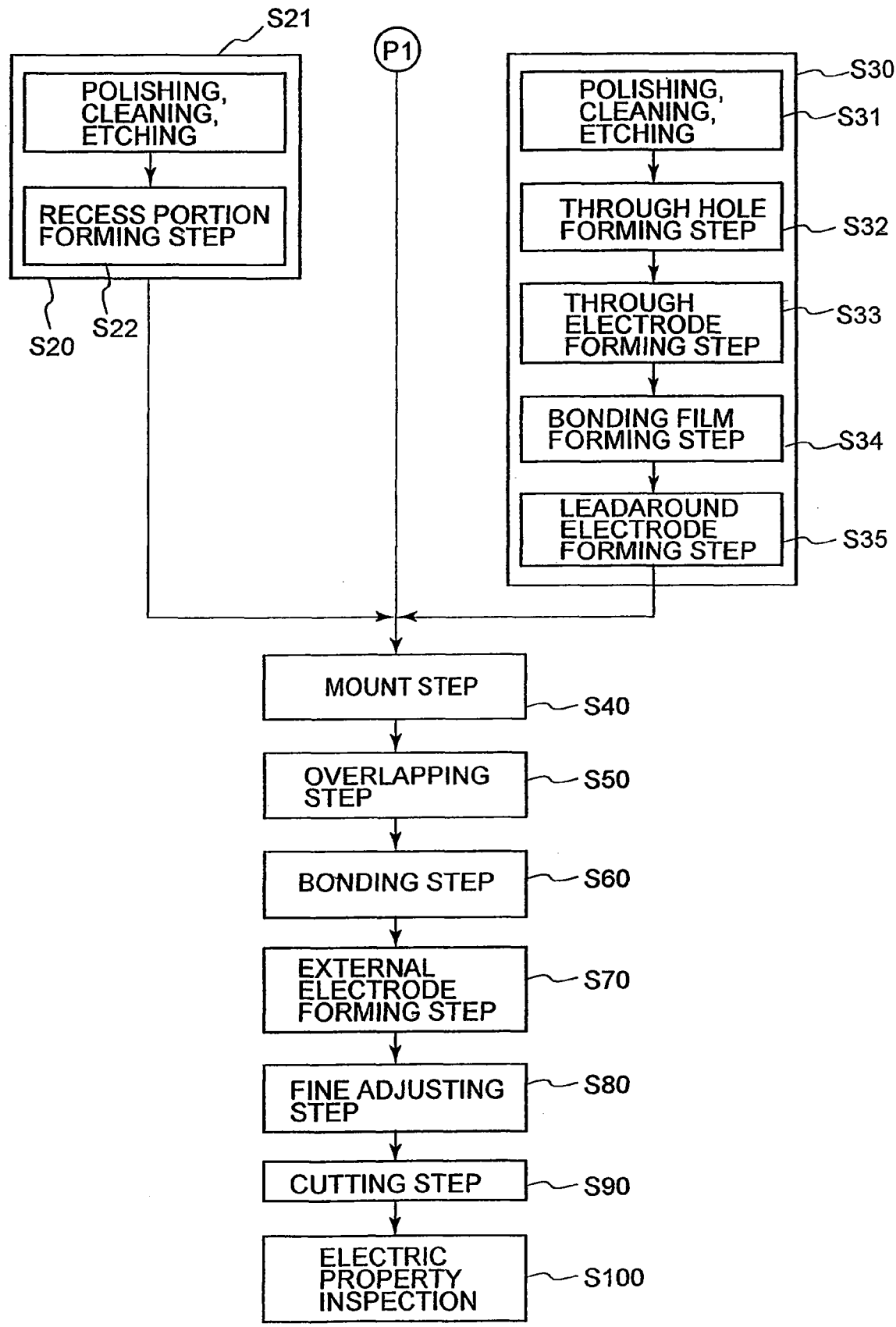
FIG. 9 is a continuation of the flowchart shown in FIG. 8.

Meanwhile, although in FIG. 9, there is constituted an order of steps of carrying out the lead around electrode forming step (S35) after the bonding film forming step (S34), inversely thereto, the bonding film forming step (S34) may be carried out after the leadaround forming step (S35), or the two steps may simultaneously be carried out. In any of the orders of steps, the same operation and effect can be achieved. Therefore, the order of steps may pertinently be changed as necessary.

Next, there is carried out a mount step of bonding the fabricated plurality of piezoelectric vibrating pieces 24 on the upper face of the wafer 46 for the base board by bumps respectively by way of the leadaround electrodes 36 and 37 (S40). First, the bumps B of gold or the like are respectively formed on the pair of leadaround electrodes 36, 37. Further, after mounting the base portion 13 of the piezoelectric vibrating piece 2 on the bump B, the piezoelectric vibrating piece 2 is pressed to the bump B while heating the bump B by a predetermined temperature. Thereby, there is brought about a state in which the piezoelectric vibrating piece 2 is mechanically supported by the bump B and the mount electrodes 22, 23 and the leadaround electrodes 36, 37 are electrically connected. Therefore, at the time point, the pair of exciting electrodes 20, 21 of the piezoelectric vibrating piece 2 are brought into a state of being respectively conducted to the pair of through electrodes 32, 33. Particularly, the piezoelectric vibrating piece 2 is bonded by the bump, and therefore, supported in a state of being floated from the upper face of the wafer 46 for the base board.

After finishing to mount the piezoelectric vibrating piece 2, there is carried out an overlapping step of overlapping the wafer 45 for the lid board to the wafer 46 for the base board (S50). Specifically, the both wafers 45, 46 are aligned to correct positions while constituting an index by a reference mark or the like, not illustrated. Thereby, there is brought about a state in which the mounted piezoelectric vibrating piece 2 is contained at inside of the cavity C surrounded by the recess portion 4a formed at the wafer 45 for the lid board and the two wafers 45, 46.

After the overlapping step, there is carried out a bonding step of putting two of the overlapped wafers 45, 46 to anodic bonding apparatus, not illustrated, to anodically bond the wafers 45, 46 by applying a predetermined voltage in a predetermined temperature atmosphere (S60). Specifically, the predetermined voltage is applied between the bonding film 35 and the wafer 45 for the lid board. Then, an electrochemical reaction is brought about at an interface of the bonding film 35 and the wafer 45 for the lid board, and the both members are respectively solidly brought into close contact with each other to be bonded anodically. Thereby, the piezoelectric piece 2 can be sealed at inside of the cavity C, and the wafer member bonded with the wafer 46 for the base board and the wafer 45 for the lid board can be provided.

Further, after finishing the anodic bonding, there is carried out an external electrode forming step of forming a plurality of pair of external electrodes 38, 39 respectively electrically connected to the pair of through electrodes 32, 33 by patterning a conductive material to a lower face of the wafer 46 for the base board (S70). By the step, the piezoelectric vibrating piece 2 sealed at the cavity C can be operated by utilizing the outer electrodes 38, 39.

Next, there is carried out a fine adjusting step of finely adjusting frequencies of individual piezoelectric vibrator 1 sealed at inside of the cavity C to be confined in a predetermined range in the state of the wafer member (S80). Specifically explaining, the piezoelectric vibrating piece 2 is vibrated by applying a voltage to the outer electrodes 38, 39. Further, the finely adjusting film of the weight metal film is evaporated by irradiating laser light from outside through the wafer 45 for the lid board while measuring the frequency. Thereby, weights on front end sides of the pair of vibrating arm portions 10, 11 are changed, and therefore, the frequency of the piezoelectric vibrating piece 2 can finely be adjusted to be confined in a predetermined range of a nominal frequency.

After finishing to finely adjust the frequency, there is carried out the cutting step of cutting to fragment the bonded wafer member along the cut line M shown in FIG. 18 (S90). As a result, the plurality of piezoelectric vibrators 1 of the surface mounting type shown in FIG. 1 in which the piezoelectric vibrating pieces 2 are sealed at inside of the cavity C formed between the base board 3 and the lid board 4 anodically bonded to each other can be fabricated at a time.

Further, there may be carried out an order of steps of carrying out the fine adjusting step (S80) after fragmenting the individual piezoelectric vibrators 1 by carrying out the cutting step (S90). However, by previously carrying out the fine adjusting step (S80), the fine adjustment can be carried out in the state of the wafer member, and therefore, the plurality of piezoelectric vibrators 1 can finely be adjusted further efficiently. Therefore, the order is further preferable since a throughput can be promoted.

Thereafter, an electric property inspection of an inner portion is carried out (S100). That is, the resonance frequency, a resonance resistance value, a drive level property (exciting power dependency of resonance frequency and resonance resistance value) of the piezoelectric vibrating piece 2 are measured and checked. Further, an insulating resistance property or the like is checked along therewith. Further, finally, by carrying out outlook inspection of the piezoelectric vibrator 1, a dimension, a quality or the like is finally checked. Thereby, fabrication of the piezoelectric vibrator 1 is finished.

When the piezoelectric vibrator 1 constituted in this way is operated, a predetermined drive voltage is applied between the pair of outer electrodes 38, 39. Thereby, a current can be made to flow to the exciting electrodes 20, 21 by way of the mount electrodes 22, 23 and the leadout electrodes 24, 25 and the pair of vibrating arm portions 11, 12 can be vibrated by a predetermined frequency.

At this occasion, the pair of exciting electrodes 20, 21 are formed such that polarities are reversed at base end sides and front end sides of the vibrating arm portions 11, 12, and therefore, as shown by FIG. 19, the vibrating arm portions 11, 12 are vibrated while bending the front ends and the base end sides in reverse directions. That is, the vibrating arm portions 11, 12 are vibrated by a vibration mode in which bending directions are reversed by centering on the connecting portions 13a. As a result, the pair of vibrating arm portions 11, 12 can be vibrated to be rotated by constituting base points by the connecting portions 13a and can be made to be proximate to and remote from each other.

Further, by utilizing the vibration of the pair of vibrating arm portions 11, 12, the vibration can be utilized as a timing source, a reference signal source or the like of a time source, a control signal.

Further, according to the embodiment, the base portion 13 supports the gravitational positions G of the vibration arm portions 11, 12 in the length direction by way of the connecting portion 13a, and therefore, rocking becomes uniform at the base end side and the front end side centering on the connecting portion 13a and the vibration is carried out stably without deflection. Therefore, a stable vibrating state can be continued to maintain for a long period of time and high performance formation can be achieved.

Further, the pair of vibrating arm portions 11, 12 are formed with the groove portions 14, and therefore, there is constituted a positional relationship in which the pair of exciting electrodes 20, 21 are partially opposed to each other by interposing the piezoelectric vibrating piece 2. Therefore, a field efficiency between the pair of exciting electrodes can be increased. Therefore, vibration loss can be restrained and vibration property can be promoted. Therefore, the CI value and the resonance frequency can be made to be low and high performance formation of the piezoelectric vibrating piece 2 can be achieved.

Particularly, according to the piezoelectric vibrating piece 2 of the embodiment, the base portion 13 of supporting the pair of vibrating arm portions 11, 12 supports middle positions of the vibrating arm portions 11, 12 by way of the connecting portion 13a, different from the background art of supporting the base end sides of the vibrating arm portions 11, 12. Further, the base portion 13 is arranged to be interposed between the pair of vibrating arm portions 11, 12. Therefore, the length of a total can be shortened by an amount of the length of the base portion 13 interposed by the pair of vibrating arm portions 11, 12.

That is, according to the background art, the base portion 13 supports the base end sides of the pair of vibrating arm portions 11, 12, and therefore, the length of the total is constituted by a numerical value of summing up the length of the vibrating arm portions 11, 12 and the length of the base portion 13. However, according to the piezoelectric vibrating piece 2 of the embodiment, even when the length of the base portion 13 is the same as that of the background art, the length of the total can be shorted. That is, the length of the piezoelectric vibrating piece 2 can be constituted by the length of the vibrating arm portions 11, 12.

As a result, small-sized formation can be achieved by shortening a total length of the piezoelectric vibrating piece 2. Further, it is not necessary to shorten the length of the base portion 13, and therefore, a state of sufficiently reducing vibration leakage can be maintained. In addition thereto, an area sufficient for mounting can be ensured, and therefore, an influence is not effected on a performance of mounting the piezoelectric piece 2 at all.

In this way, according to the piezoelectric vibrating piece 2 of the embodiment, after ensuring the length of the base portion 13 to be able to sufficiently reduce the vibration leakage, the total length is shortened without effecting any influence also on a mounting performance to thereby achieve small-sized formation.

Further, according to the piezoelectric vibrator 1 of the embodiment, the above-described piezoelectric vibrating piece 2 is provided, and therefore, small-sized formation can be achieved by making a total length shorter than that of the background art, and needs for small-sized formation can be dealt with. Further, there is provided the piezoelectric vibrating piece 2 sufficiently reducing vibration leakage and excellent in mounting performance, and therefore, high quality piezoelectric vibrator 1 promoting reliability can be constituted.

Further, the piezoelectric vibrator 1 is constituted by the glass package type of the surface mounting type of hermetically closing the piezoelectric vibrating piece 2 at inside of the cavity C, and therefore, the piezoelectric vibrating piece 2 can be vibrated without being influenced by dust and dirt or the like and high quality formation can be achieved. In addition thereto, owing to the surface mounting type, the piezoelectric vibrator 1 can easily be mounted and is excellent in stability after having been mounted.

Further, although according to the above-described embodiment, an example is taken by the case of respectively forming the groove portions 14 to the pair of vibrating arm portions 11, 12, the groove portion 14 is not indispensable but the groove portion 14 may not be formed. However, by forming the groove portion 14, the CI value can be made to be low, and therefore, the groove portion 14 is preferable.

Figure 20:
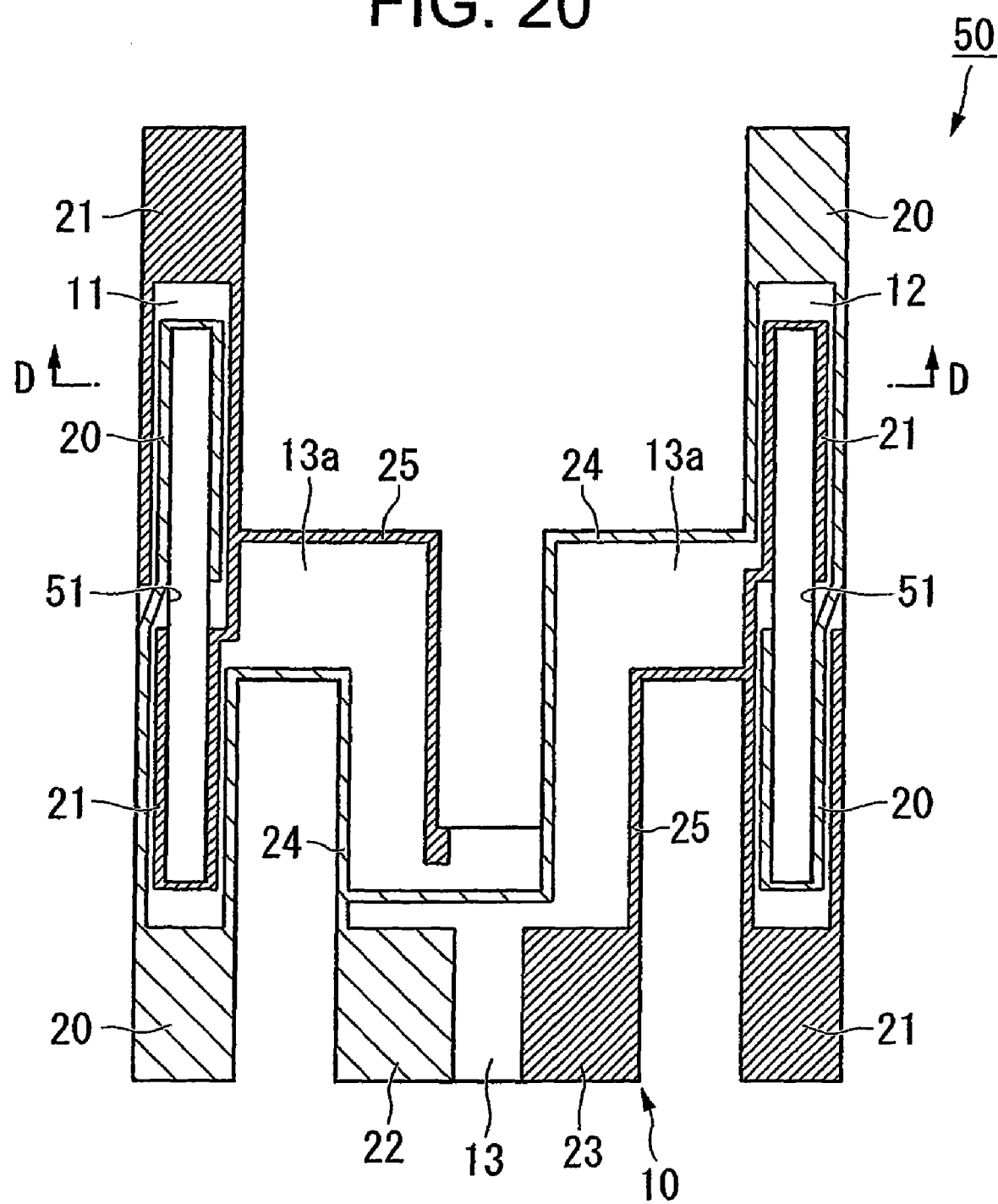
FIG. 20 is a view showing a modified example of a piezoelectric vibrating piece according to the invention and is a view viewing a piezoelectric vibrating piece formed with through holes at a pair of vibrating arm portions from an upper face.
Figure 21:
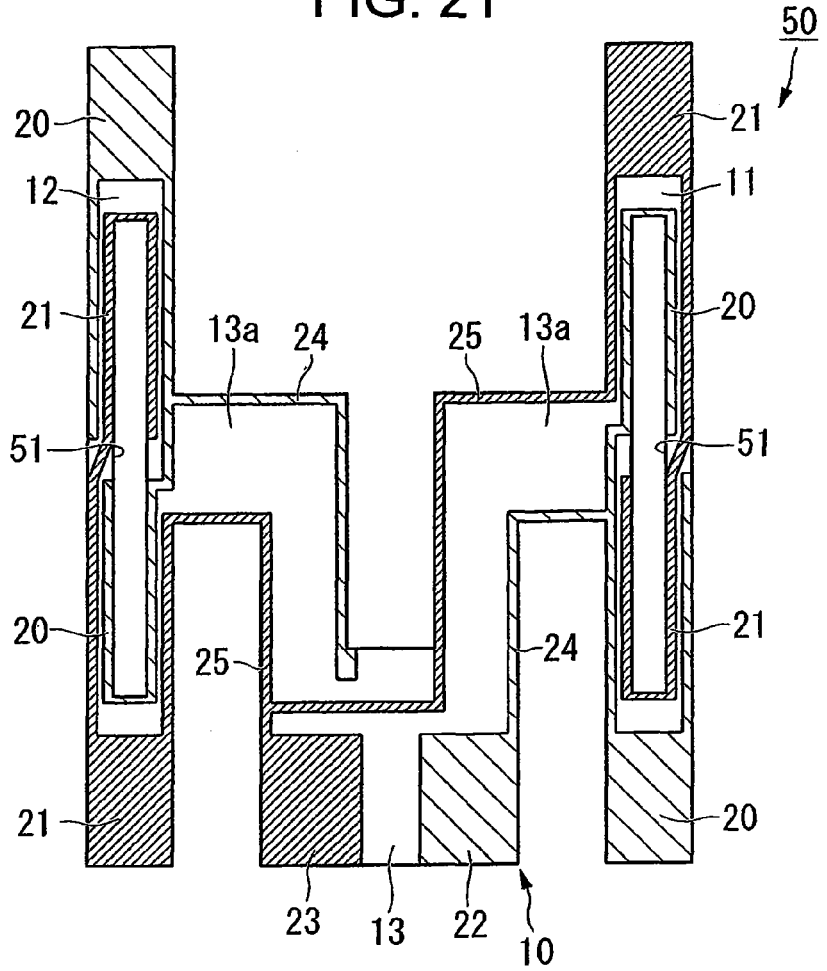
FIG. 21 is a view viewing the piezoelectric vibrating piece shown in FIG. 20 from a lower face.
Figure 22:
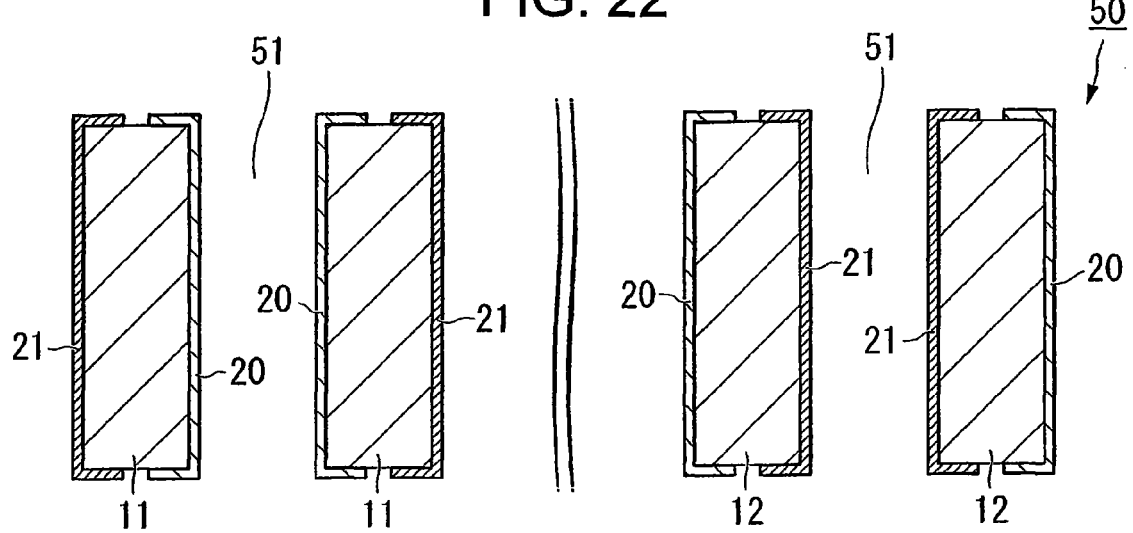
FIG. 22 is a sectional view taken along a line D-D shown in FIG. 20.

Further, not the groove portion 14 but two holes 51 penetrating both faces of the vibrating arm portions 11, 12 along the length direction may be formed as shown by FIG. 20 through FIG. 22. According to a piezoelectric vibrating piece 50 constituted in this way, as shown by FIG. 22, the pair of exciting electrodes 20, 21 are brought into a completely opposed positional relationship by interposing the vibrating arm portions 11, 12 therebetween, and therefore, the field efficiency between the pair of exciting electrodes 20, 21 can maximally be promoted. Therefore, the vibration loss can further effectively be restrained and the vibration property can be promoted far excellently. Therefore, the CI value and the resonance frequency can be made to be lower than those in the case of forming the groove portion 14, and further small-sized formation of the piezoelectric vibrating piece 50 can be achieved.

Figure 23:
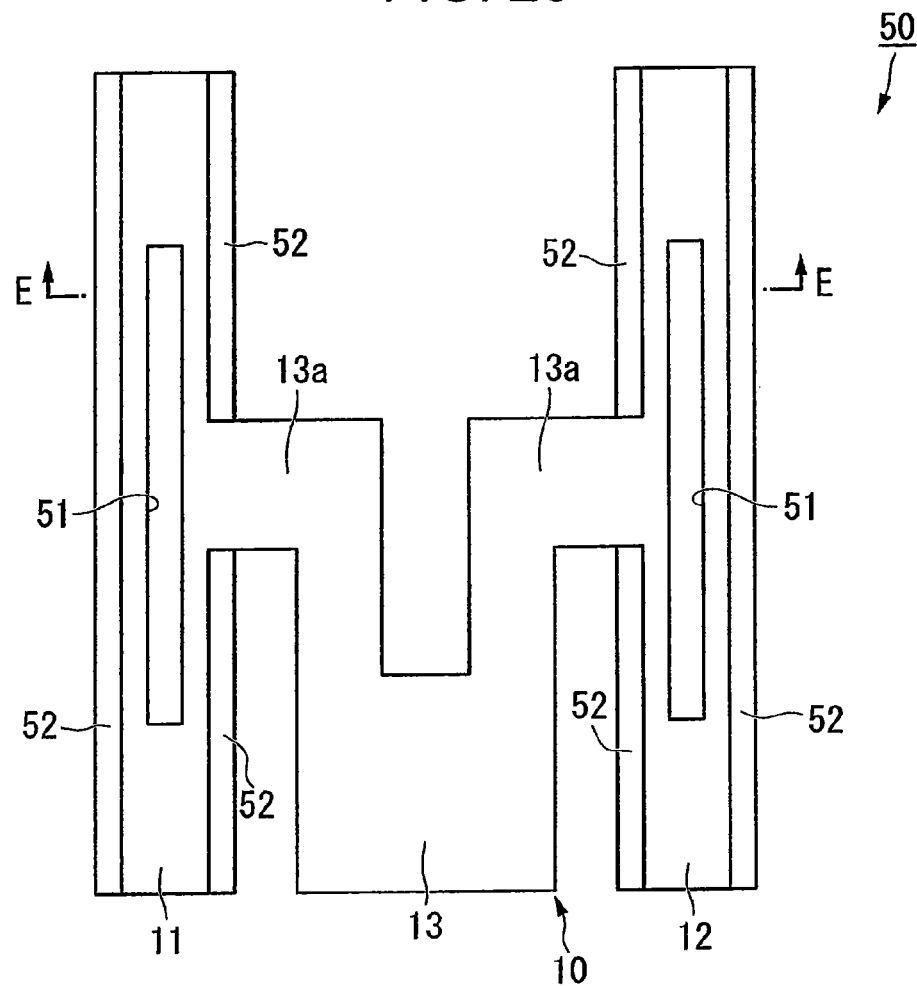
FIG. 23 is a view showing a modified example of the piezoelectric vibrating piece shown in FIG. 20 and is a view showing a piezoelectric vibrating piece formed with reinforcing portions on both sides of the vibrating arm portions.
Figure 24:
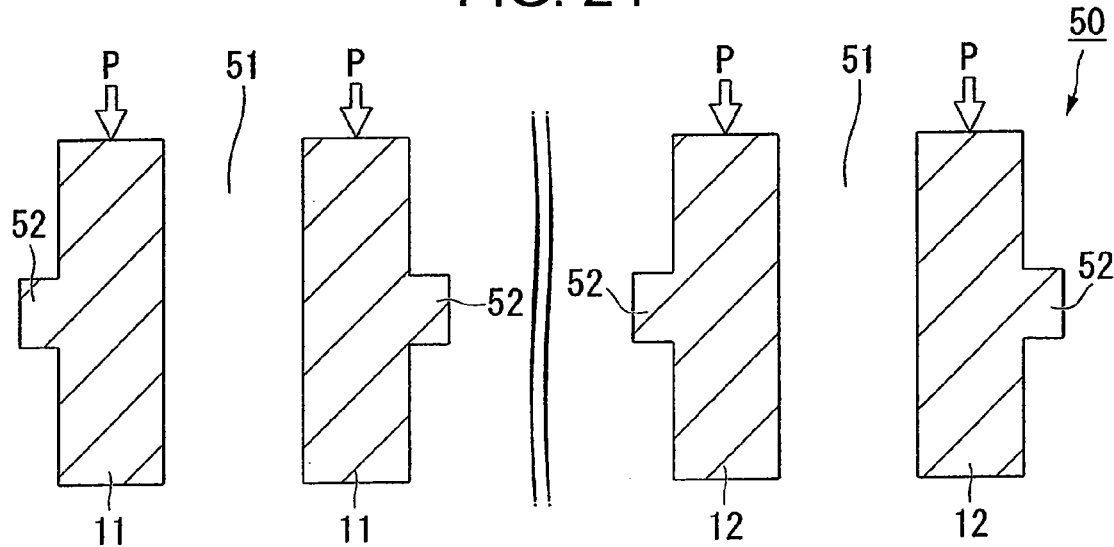
FIG. 24 is a sectional view taken along a line E-E shown in FIG. 23.

Meanwhile, when the through holes 51 are formed to the vibrating arm portions 11, 12 as described above, as shown by FIG. 23 and FIG. 24, it is preferable to form reinforcing portions 52 projected in width directions of the vibrating arm portions 11, 12 respectively at side face of the vibrating arm portions 11, 12. Further, in FIG. 23, FIG. 24, illustration of the exciting electrodes 20, 21, the readout electrodes 24, 25 and the mount electrodes 22, 23 is omitted. Further, although the example is taken by the case of forming the reinforcing portions 52 continuously from base ends to front ends at the side faces on both sides of the vibrating arm portions 11, 12, the reinforcing portions 52 may be formed at least in regions of forming the through holes 51.

When the reinforcing portion 52 is formed, in an outer shape forming step, the wafer S may be etched to form the reinforcing portions 52 integrally with the vibrating arm portions 11, 12.

By forming the reinforcing portions 52 in this way, even when the through holes 51 are formed at the vibrating arm portions 11, 12, a reduction in a rigidity by the through hole 51 can be compensated for. Particularly, the reinforcing portions 52 are formed from the base ends to the front ends of the vibrating arm portions 11, 12 (over a region exceeding a region of forming the through hole 51), and therefore, a portion a width of which is narrowed by the through hole 51 (portion of arrow mark P shown in FIG. 24) can be reinforced. Therefore, the vibrating arm portions 11, 12 can further stably be vibrated without bringing about bending, deformation or the like.

Figure 25:
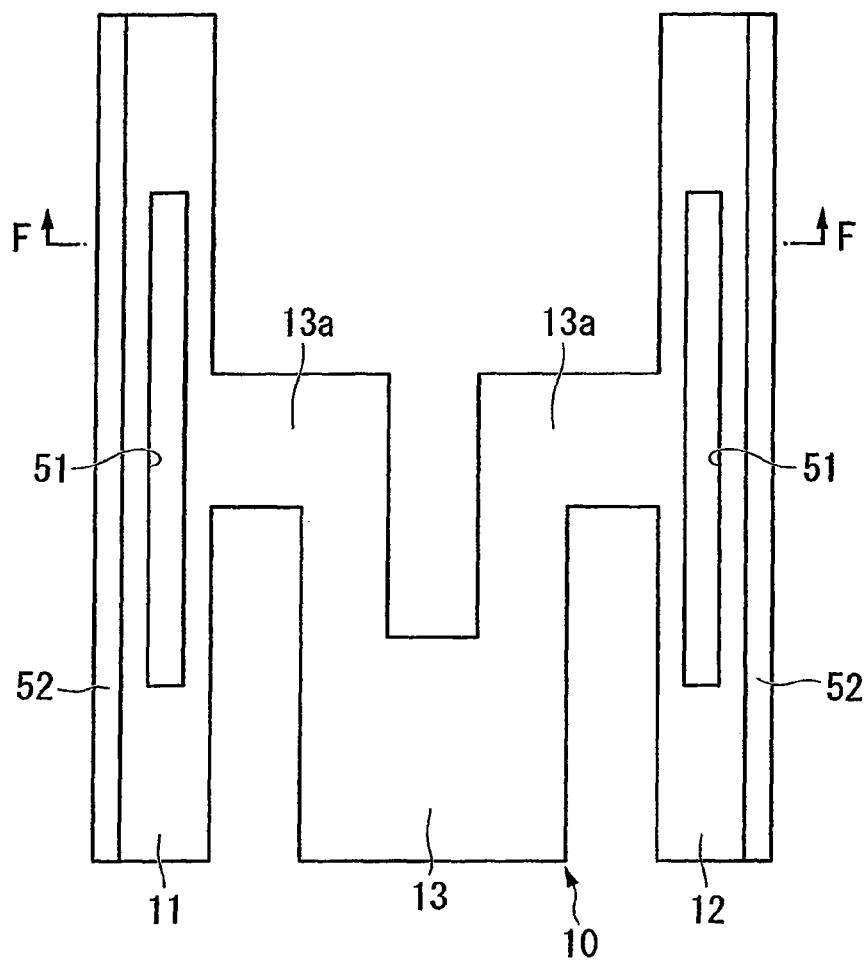
FIG. 25 is a view showing a modified example of the piezoelectric vibrating piece shown in FIG. 20 and is a view showing a piezoelectric vibrating piece formed with a reinforcing portion on one side (outer side) of a vibrating arm portion.
Figure 26:
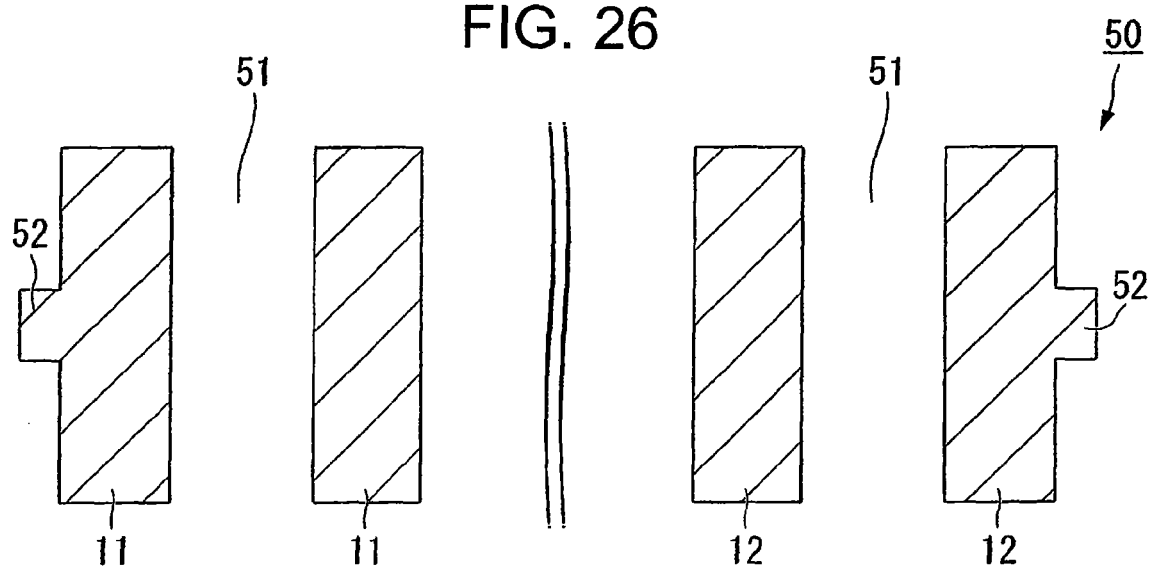
FIG. 26 is a sectional view taken along a line F-F shown in FIG. 25.
Figure 27:
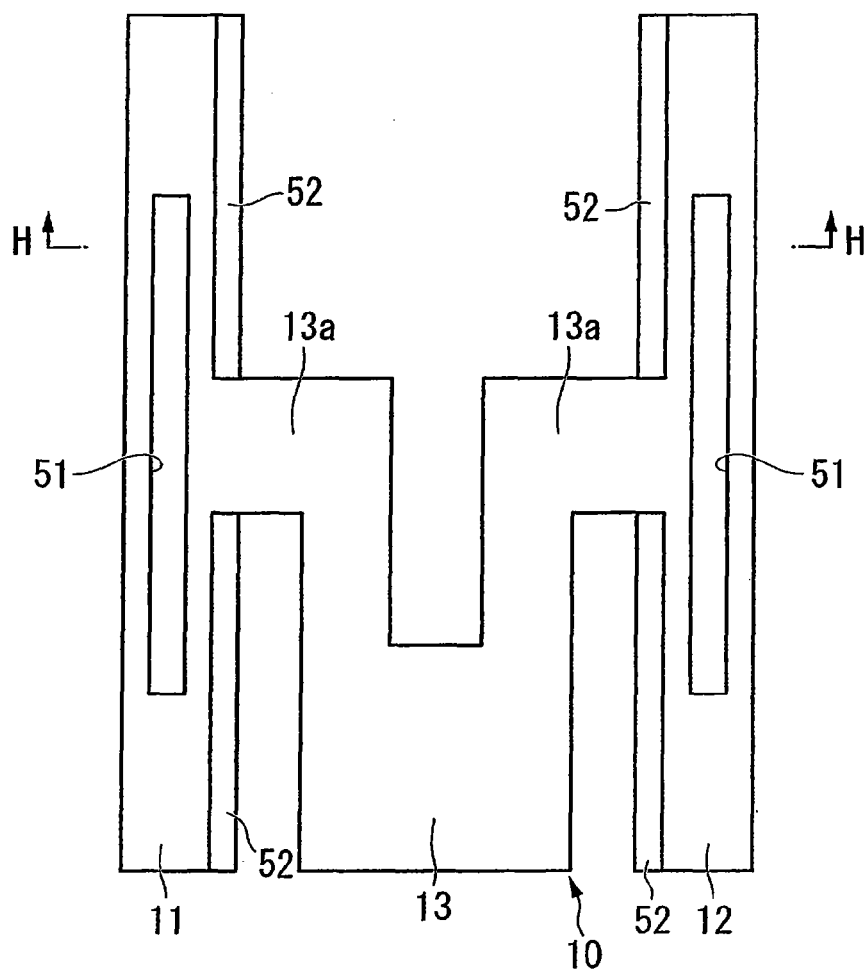
FIG. 27 is a view showing a modified example of the piezoelectric vibrating piece shown in FIG. 20 and is a view showing a piezoelectric vibrating piece formed with a reinforcing portion on one side (inner side) of a vibrating arm portion.
Figure 28:
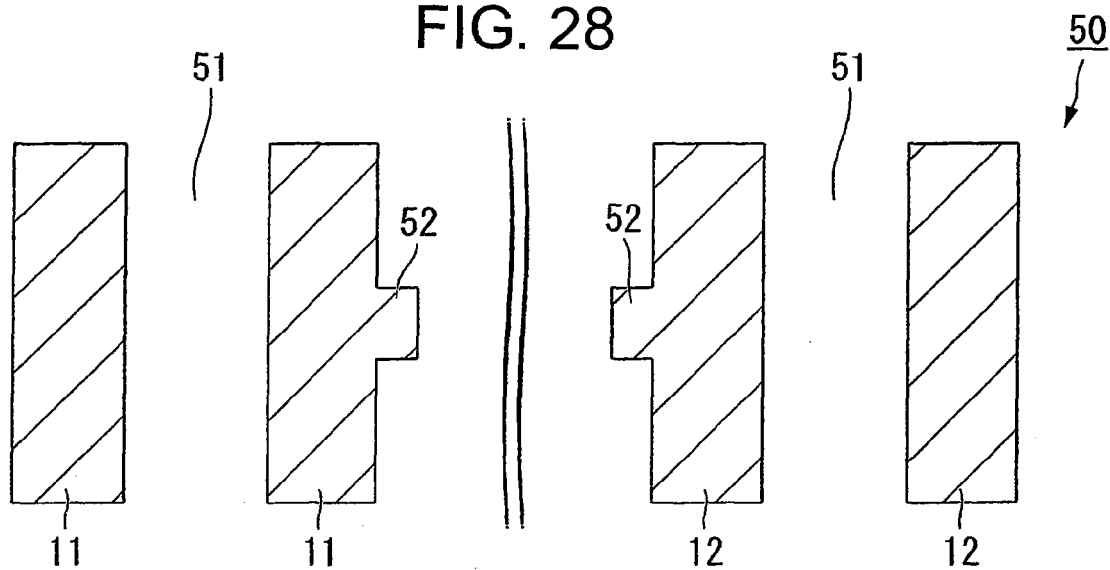
FIG. 28 is a sectional view taken along a line H-H shown in FIG. 27.

Further, although it is preferable to form the reinforcing portions 52 respectively on the both sides of the vibrating arm portions 11, 12 as described above, as shown by FIG. 25 and FIG. 26, the reinforcing portions 52 may be formed only on one sides (outer sides) of the vibrating arm portions 11, 12, as shown by FIG. 27 and FIG. 28, the reinforcing portions 52 may be formed only on another one sides (inner sides) of the vibrating arm portions 11, 12.

Even in the cases, a reduction in the rigidity by the through hole 51 can be reinforced, and therefore, similar operation and effect can be achieved. Further, also in FIG. 25 through FIG. 28, illustration of the exciting electrodes 20, 21, the leadout electrodes 24, 25 and the mount electrodes 22, 23 is omitted.

Further, although according to the embodiment, as an example of the piezoelectric vibrator, an explanation is given by taking an example of the piezoelectric vibrator of a glass package type of the surface mounting type, the invention is not limited to the piezoelectric vibrator of this type. For example, a piezoelectric vibrator of so-to-speak ceramic package type of forming a mount electrode on an insulating board of ceramic or the like, connecting a mount electrode of a piezoelectric vibrating piece to the mount electrode, thereafter, constituting an airtightness by a lid of glass, metal or the like will do.

Figure 29:
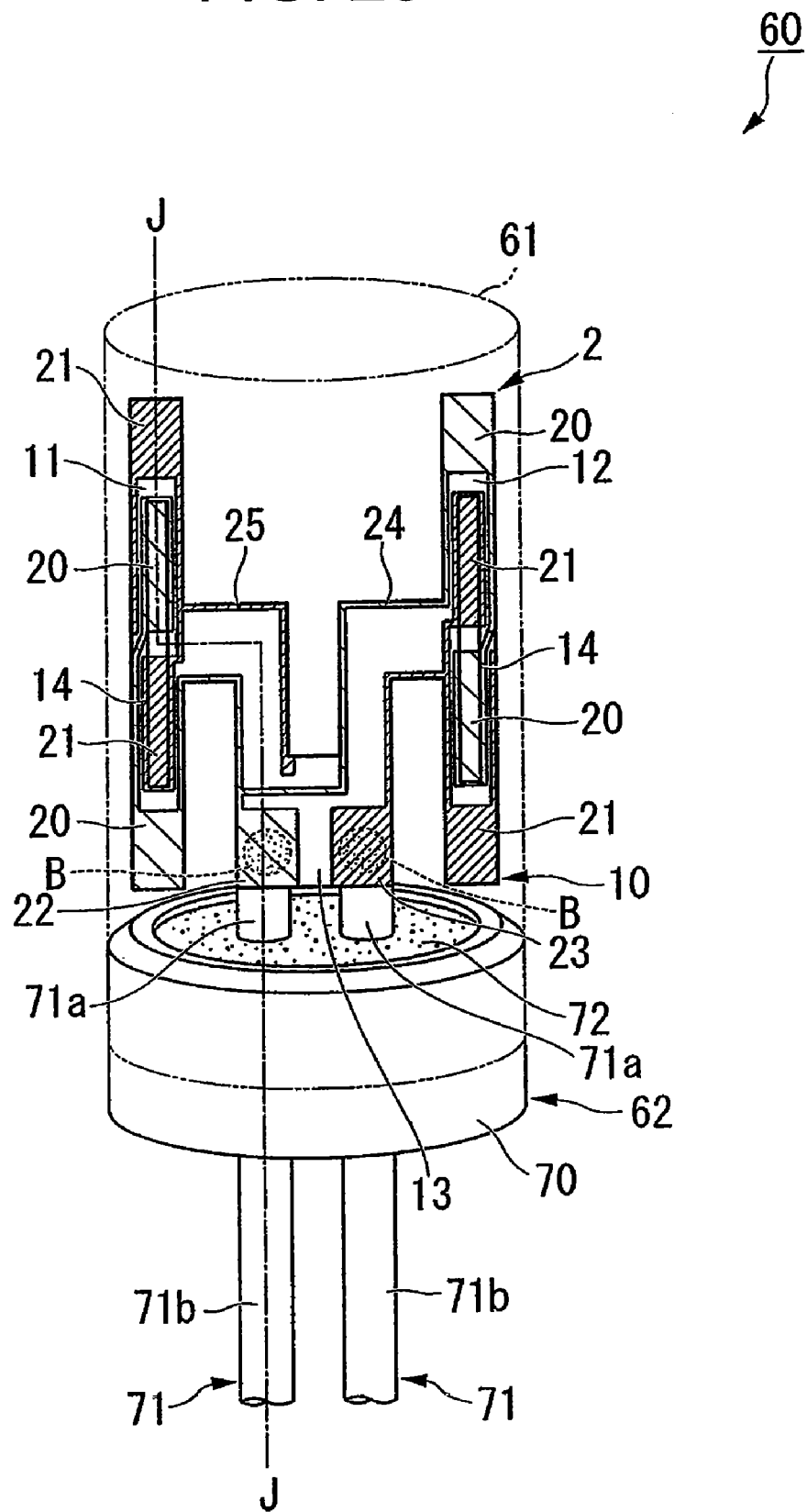
FIG. 29 is a view showing a modified example of a piezoelectric vibrator according to the invention and is a top view of a piezoelectric vibrator of a cylinder package type.

Further, a piezoelectric vibrator not of a surface mounting type but, for example, a cylinder package type as shown by FIG. 29 will do. Next, a simple explanation will be given of a piezoelectric vibrator of the cylinder package type.

Figure 30:
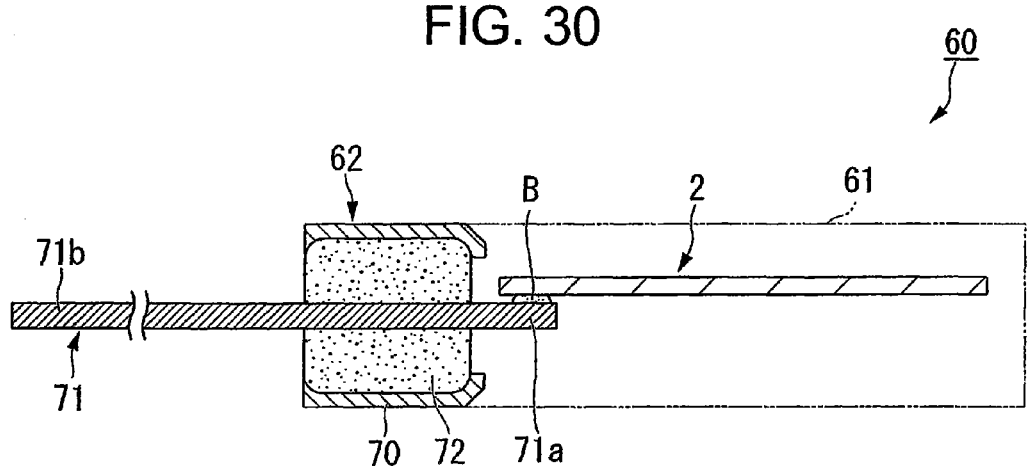
FIG. 30 is a sectional view taken along a line J-J shown in FIG. 29.

As shown by FIG. 29 and FIG. 30, the piezoelectric vibrator 60 includes the piezoelectric vibrating piece 2, a case 61 containing the piezoelectric vibrating piece 2 at inside thereof, and an airtight terminal 62 hermetically closing the piezoelectric vibrating piece 2 at inside of the case 61.

The piezoelectric vibrating piece 2 is mounted to an inner lead 71*a* of a lead terminal 71 constituting the airtight terminal 62 in a state of being contained at inside of the case 61.

The case 61 is formed in a shape of a bottomed circular cylinder and is press-fit to be fitted to be fixed to an outer periphery of a stem 70 mentioned later of the airtight terminal 62. Further, the case 61 is press-fit in vacuum and a space surrounding the piezoelectric vibrating piece 2 at inside of the case 61 is brought into a state of being maintained in vacuum.

The airtight terminal 62 hermetically closes inside of the case 61 and includes the stem 70 press-fit to be fixed to inside of the case 61, 2 pieces of the lead terminals 71 one end sides of which are made to constitute the inner leads 71*a* arranged in a state of penetrating the stem 70 and interposing the stem 70 therebetween and electrically connected to the pair of mount electrode 22, 23 of the piezoelectric vibrating piece 2, and other end sides of which are made to constitute outer leads 71*b* electrically connected to outside and a filling member 72 for fixing the lead terminal 71 and the stem 70.

The stem 70 is formed in a ring-like shape by a metal material (for example, low carbon steel (Fe)), iron nickel alloy (Fe—Ni), iron nickel cobalt alloy (Fe—Ni—Co)). Further, a material of the filling member 72 is, for example, borosilicate glass. Further, an outer periphery of the stem 70 is coated with a plating (metal film) by a material the same as that of the lead terminal 71.

The lead terminal 71 is formed by, for example, a conductive material which is a material the same as that of the stem 70, a portion thereof projected to inside of the case 61 is made to constitute the inner lead 71*a*, and a portion thereof projected to outside of the case 61 is made to constitute the outer lead 71*b*. Further, the piezoelectric vibrating piece 2 is mechanically mounted by a conductive bump B of gold or like in a state of being mounted to a front end of the inner lead 71*a*. That is, the inner leads 71*a* and the mount electrodes 22, 23 are mechanically bonded, at the same time, electrically connected by way of the bumps B. As a result, the piezoelectric vibrating piece 2 is brought into a state of being mounted to 2 pieces of the lead terminals 71.

Further, as a material of platings of the stem 70 and the lead terminal 71 constituting the piezoelectric vibrator 60 of the embodiment, heat resistance solder plating, tin copper alloy, gold tin alloy or the like is used. Further, inside of the case 61 can be sealed in airtight in a vacuum state by subjecting the case 61 to cold pressure welding in vacuum by interposing a plating at an outer periphery of the stem 70.

Figure 31:
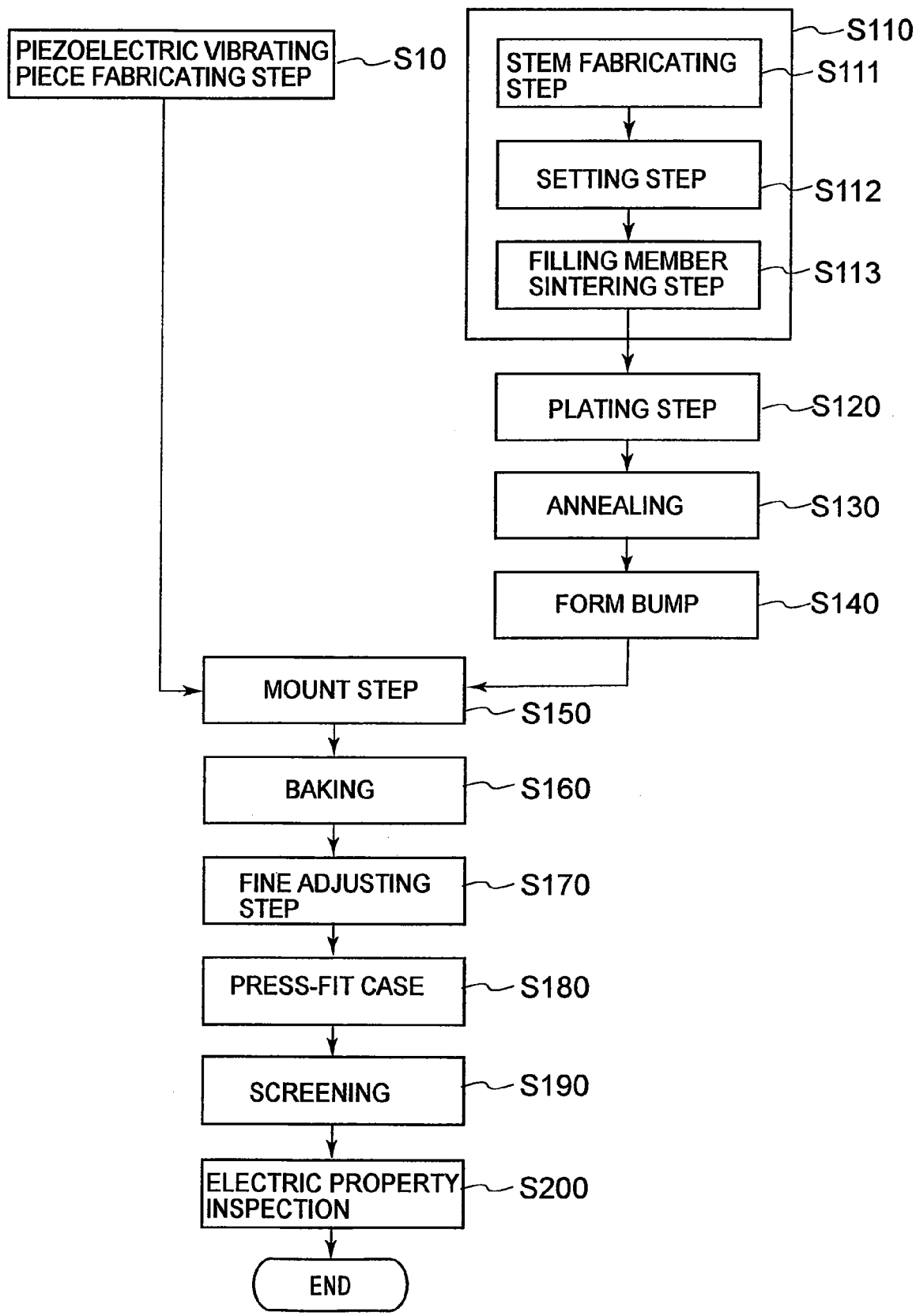
FIG. 31 is a flowchart in fabricating the piezoelectric vibrator shown in FIG. 29.

Next, a method of fabricating the piezoelectric vibrator 60 of the cylinder package type will be explained as follows in reference to a flowchart shown in FIG. 31.

First, the piezoelectric vibrating piece 2 is fabricated by carrying out a piezoelectric vibrating piece fabricating step (S10). Further, the step has already been explained in details, and therefore, an explanation thereof will be omitted.

Next, an airtight terminal of fabricating step of fabricating the airtight terminal 62 is carried out (S110). Specifically, the stem 70 is fabricated by a stem fabricating step (S111). That is, a plate member having a conductivity of iron nickel cobalt alloy, iron nickel alloy or the like is worked into a lance, thereafter, subjected to a deep drawing of a plurality of times to thereby form a bottomed cylinder member. Further, the stem 70 is fabricated by forming an opening at a bottom face of the cylinder member and cutting to separate the cylinder member from the plate member by carrying out outer shape drawing.

Next, a setting step of respectively setting the lead terminal 71 and the filling member 72 to inside of the stem 70 is carried out (S112). First, the fabricated stem 70 is set to an exclusive jig, not illustrated, thereafter, the filling member 72 previously sintered in a ring-like shape is set to inside of the stem 70 and the lead terminal 71 is set to penetrate the filling member 72.

After combining the stem 70 and the lead terminal 71 and the filling member 72 by the setting step, the jig is put into a heating furnace and the filling member 72 is sintered in a temperature atmosphere around 1000° C. (S113). Thereby, an interval between the filling member 72 and the lead terminal 71 and an interval between the filling member 72 and the stem 70 are completely sealed to attach to constitute a structure of withstanding airtightness. Further, the airtight terminal 62 can be provided by being taken out from the jig. At the time point, the airtight terminal fabricating step is finished.

Next, there is carried out a plating step of coating the outer surface of the lead terminal 71 and the outer periphery of the stem 70 by a metal film or the same material by a wet plating method (S120). As a pretreatment therefor, the outer surface of the lead terminal 71 and the outer periphery of the stem 70 are cleaned, degreased by an alkaline solution, thereafter, cleaned by an acid by a solution of hydrochloric acid and sulfuric acid. After finishing the pretreatment, a matrix metal film is formed on the outer surface of the lead terminal 31 and the outer peripheral face of the stem 70. For example, Cu plating or Ni plating is coated by a film thickness of substantially 2 μm through 5 μm. Successively, a finish metal film is formed on the matrix metal film. For example, other than a single material of tin, silver or the like, heat resistant plating, tin copper alloy, tin bismuth film alloy, tin antimony alloy or the like is coated by a film thickness of substantially 8 μm through 15 μm.

By coating the metal film including the matrix metal film and the finish metal film in this way, the inner lead 71*a* and the piezoelectric vibrating piece 2 can be connected. Further, not only connection of the piezoelectric vibrating piece 2, but the metal film coated on the outer periphery of the stem 70 is provided with a property of being soft and elastically deformed, and therefore, cold pressure welding of the stem 70 and the case 61 can be carried out and airtight bonding can be carried out.

Successively, annealing is carried out in a furnace of a vacuum atmosphere to stabilize the metal film (S130). For example, heating is carried out for one hour at a temperature of 170° C. Thereby, whisker can be restrained from being brought about by adjusting a composition of an intermetalic compound formed at an interface of a material of the matrix metal film and a material of the finish metal film. At a time point of finishing the annealing, a mount step of mounting the piezoelectric vibrating piece 2 can be carried out. Further, although an example is taken by a case of carrying out the wet plating method in coating the metal film, the invention is not limited to the case but, for example, the coating may be carried out by a vapor deposition method, a chemical gas phase method or the like.

Further, according to the embodiment, after finishing the annealing, a conductive bump B of gold or the like is formed at a front end of the inner lead 71a for the mount step which is successively carried out (S140). Further, portions of forming the bumps B are overlapped by the mount electrodes 22, 23 formed on the outer surface of the base portion 13. Further, the inner lead 71a and the piezoelectric vibrating piece 2 are overlapped by a predetermined pressure by way of the bump B while heating the bump B. Thereby, the piezoelectric vibrating piece 2 can be mounted to the inner lead 71a (S150). That is, the piezoelectric vibrating piece 2 is mechanically supported by the lead terminal 71 in a state of electrically connecting the pair of mount electrodes 22, 23 and the inner leads 71a.

Further, although in connecting the bump B, mounting is carried out by carrying out heating and pressurizing, the connection may be carried out by the bump B by utilizing an ultrasonic wave.

Next, in order to eliminate a strain by mounting, baking is carried out at a predetermined temperature (S160). Successively, before fixing the case 61, frequency adjustment (fine adjustment) of the piezoelectric vibrating piece 2 is carried out (S170). Specifically explaining of the frequency adjustment, the piezoelectric vibrating piece 2 is vibrated by applying a voltage between the outer leads 71b in a state of putting a total thereof into a vacuum chamber. Further, the frequency is adjusted by evaporating the fine adjusting film of the weight metal film by laser while measuring the frequency. By carrying out the frequency adjustment, the frequency of the piezoelectric vibrating piece 2 can be adjusted to a previously determined range of frequency.

Further, although in the fine adjustment and the rough adjustment carried out previously, the frequency adjustment is carried out by evaporating the weight metal film by irradiating laser, not laser but argon ion may be utilized. In this case, the frequency adjustment is carried out by removing the weight metal film by carrying out the sputtering by irradiating argon ion.

Next, there is carried out a sealing step of sealing the piezoelectric vibrating piece 2 in airtight by press-fitting the case 61 to the stem 70 to contain the mounted piezoelectric vibrating piece 2 at inside thereof (S180). Specifically explaining, the case 61 is press-fit to the outer periphery of the stem 70 of the airtight terminal 62 while applying a predetermined load in vacuum. Then, the metal film formed on the outer periphery of the stem 70 is elastically deformed, and therefore, sealing can be carried out in airtight by cold pressure welding. Thereby, the piezoelectric vibrating piece 2 can be sealed in vacuum at inside of the case 61.

Further, it is preferable to detach moisture or the like adsorbed to the surface by sufficiently heating the piezoelectric vibrating piece 2, the case 61 and the airtight terminal 62 before carrying out the step.

Further, after finishing to fix the case 61, screening is carried out (S190). The screening is carried out for stabilizing the frequency or a resonance resistance value and restraining metal whisker caused by a compressive stress from being brought about at a fitting portion press-fit to the case 61. After finishing the screening, an electric property inspection of an inner portion is carried out (S200). That is, the resonance frequency, the resonance resistance value, a drive level property (exciting power dependency of resonance frequency and resonance resistance value) or the like of the piezoelectric vibrating piece 2 is measured and checked. Further, an insulating resistance property or the like is checked along therewith. Further, finally, a dimension, a quality or the like is finally checked by carrying out an outlook inspection of the piezoelectric vibrator 60. As a result, a plurality of the piezoelectric vibrators 60 shown in FIG. 29 and FIG. 30 can be fabricated at a time.

Even the piezoelectric vibrator 60 constituted in this way is provided with the piezoelectric vibrating piece 2 having a short total length and downsized in a state of sufficiently reducing vibration leakage, and therefore, small-sized formation can be achieved by similarly shortening the total length. Further, the piezoelectric vibrator 60 is of the cylinder package type of hermetically closing the piezoelectric vibrating piece 2 to inside of the case 61, and therefore, the piezoelectric vibrating piece 2 can be vibrated without being influenced by dust and dirt or the like and high quality formation can be achieved.

Further, a surface mounting type vibrator 80 may be constituted by fixing the piezoelectric vibrator 60 of the cylinder package type further by a mold resin portion 81.

Figure 32:
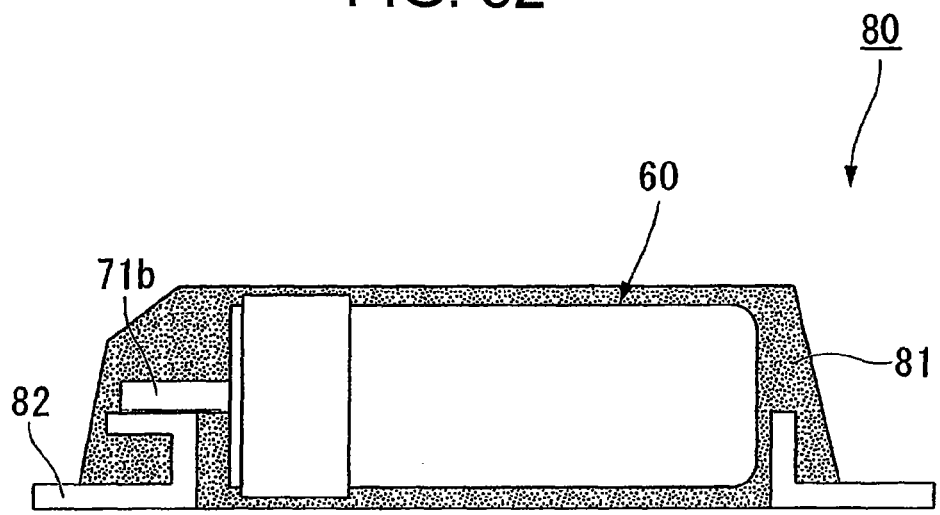
FIG. 32 is a view showing a modified example of a piezoelectric vibrator according to the invention and is a sectional view of a piezoelectric vibrator of a surface mounting type molding a surrounding of the piezoelectric vibrator shown in FIG. 29 by a mold resin portion.
Figure 33:
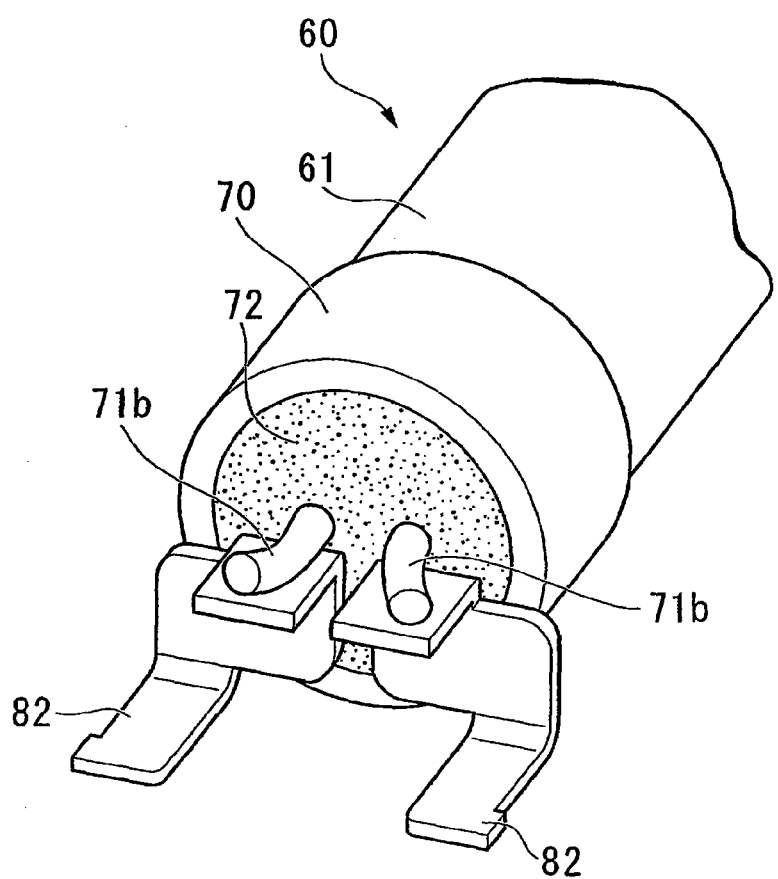
FIG. 33 is a perspective view showing a relationship of attaching the piezoelectric vibrator shown in FIG. 32 and an external portion connecting terminal.

As shown by FIG. 32 and FIG. 33, the surface mounting type vibrator 80 includes the piezoelectric vibrator 60, the mold resin portion 81 of fixing the piezoelectric vibrator 60 by a predetermined shape, an external portion connecting terminal 82 one end side of which is electrically connected to the outer lead 71b and other end of which is electrically connected to outside by being exposed to a bottom face of the mold resin portion 81.

The external portion connecting terminal 82 is formed in a channel-like shape in a section thereof by a metal material of copper or the like. By fixing the piezoelectric vibrator 60 by the mold resin portion 81 in this way, the piezoelectric vibrator 60 can stably be attached to a circuit board or the like, and therefore, the piezoelectric vibrator 60 is easier to use and easiness of use is promoted. Particularly, the piezoelectric vibrator 60 is downsized, and therefore, small-sized formation can be achieved also with regard to the surface mounting type vibrator 80 per se.

Next, an embodiment of an oscillator according to the invention will be explained in reference to FIG. 34.

Figure 34:
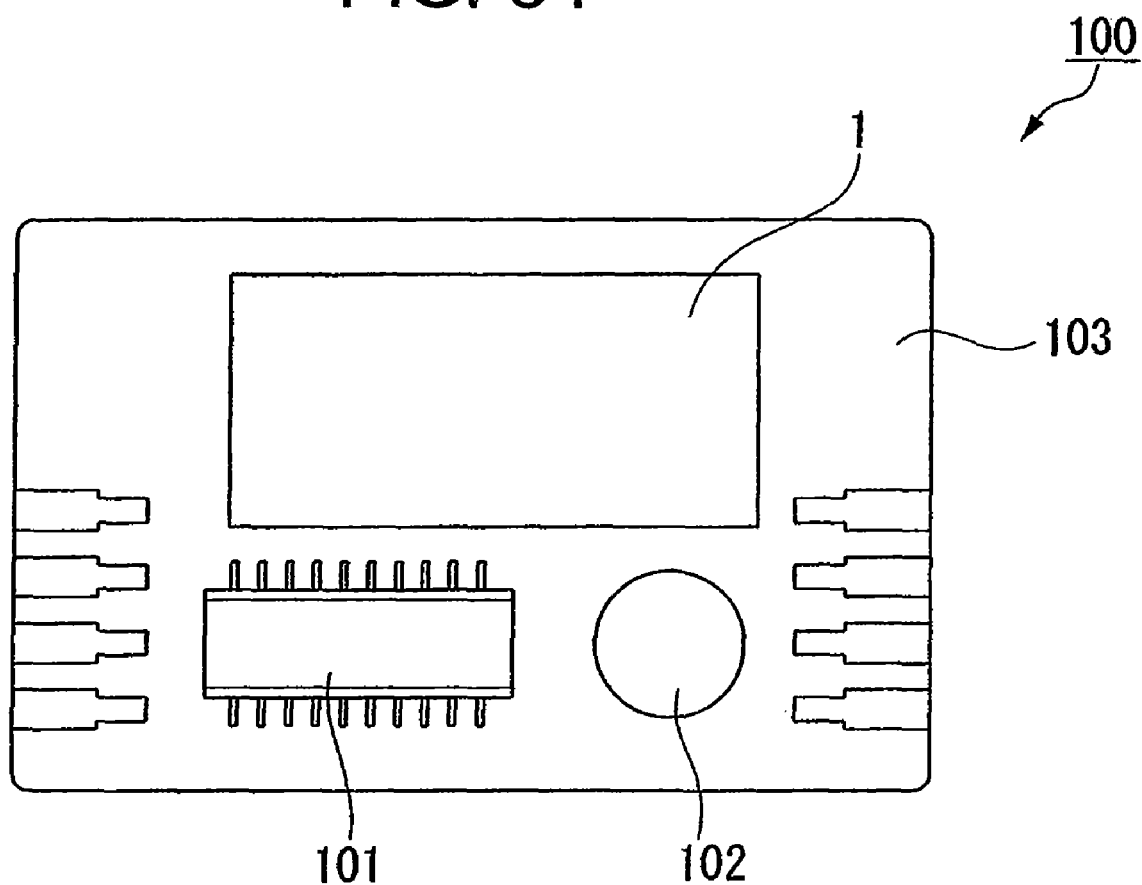
FIG. 34 is a constitution view showing an embodiment of an oscillator according to the invention.

As shown by FIG. 34, an oscillator 100 of the embodiment constitutes the piezoelectric vibrator 1 as an oscillating piece electrically connected to an integrated circuit 101. The oscillator 100 includes a board 103 mounted with an electronic part 102 of a capacitor or the like. The board 103 is mounted with the integrated circuit 101 for the oscillator and a vicinity of the integrated circuit 101 is mounted with the piezoelectric vibrating piece 2 of the piezoelectric vibrator 1. The electronic part 102, the integrated circuit 101 and the piezoelectric vibrator 1 are respectively electrically connected by a wiring pattern, not illustrated. Further, respective various constituent parts are molded by a resin, not illustrated.

In the oscillator 100 constituted in this way, when a voltage is applied to the piezoelectric vibrator 1, the piezoelectric vibrating piece 2 at inside of the piezoelectric vibrator 1 is vibrated. The vibration is converted into an electric signal by a piezoelectric property provided to the piezoelectric vibrating piece 2 and is inputted to the integrated circuit 101 as the electric signal. The inputted electric signal is variously processed by the integrated circuit 101 and is outputted as a frequency signal. Thereby, the piezoelectric vibrator 1 is made to function as an oscillating piece.

Further, a constitution of the integrated circuit 101 can be added with a function of controlling date or time of operating the apparatus or an external apparatus, providing time, calendar or the like other than a single function oscillator of a timepiece or the like by selecting, for example, RTC (real time clock) module or the like in accordance with a request.

According to the oscillator 100 of the embodiment, the above-described piezoelectric vibrator 1 is provided, and therefore, small-sized formation of the oscillator 100 per se can be achieved and a reliability of a product can be achieved. Further, in addition thereto, a highly accurate frequency signal which is stable over a long period of time can be provided.

Next, an explanation will be given of an embodiment of an electronic apparatus according to the invention in reference to FIG. 35.

Further, as an electronic apparatus, an explanation will be given by taking an example of a portable information apparatus 110 having the piezoelectric vibrator 1. First, the portable information apparatus 110 of the embodiment is represented by, for example, a portable telephone and develops and improves a wristwatch according to the background art. An outlook thereof is similar to a wristwatch, a liquid crystal display is arranged at a portion thereof in correspondence with a dial and current time or the like is displayed on the screen. Further, when utilized as the communicating machine, the electronic apparatus is detached from the wrist, and can carry out a communication similar to that of the portable telephone of the background art by a speaker and a microphone included on an inner side of a strap. However, the electronic apparatus is remarkably small-sized and light-weighted in comparison with the portable telephone of the background art.

Next, a constitution of a portable information apparatus 110 of the embodiment will be explained.

Figure 35:
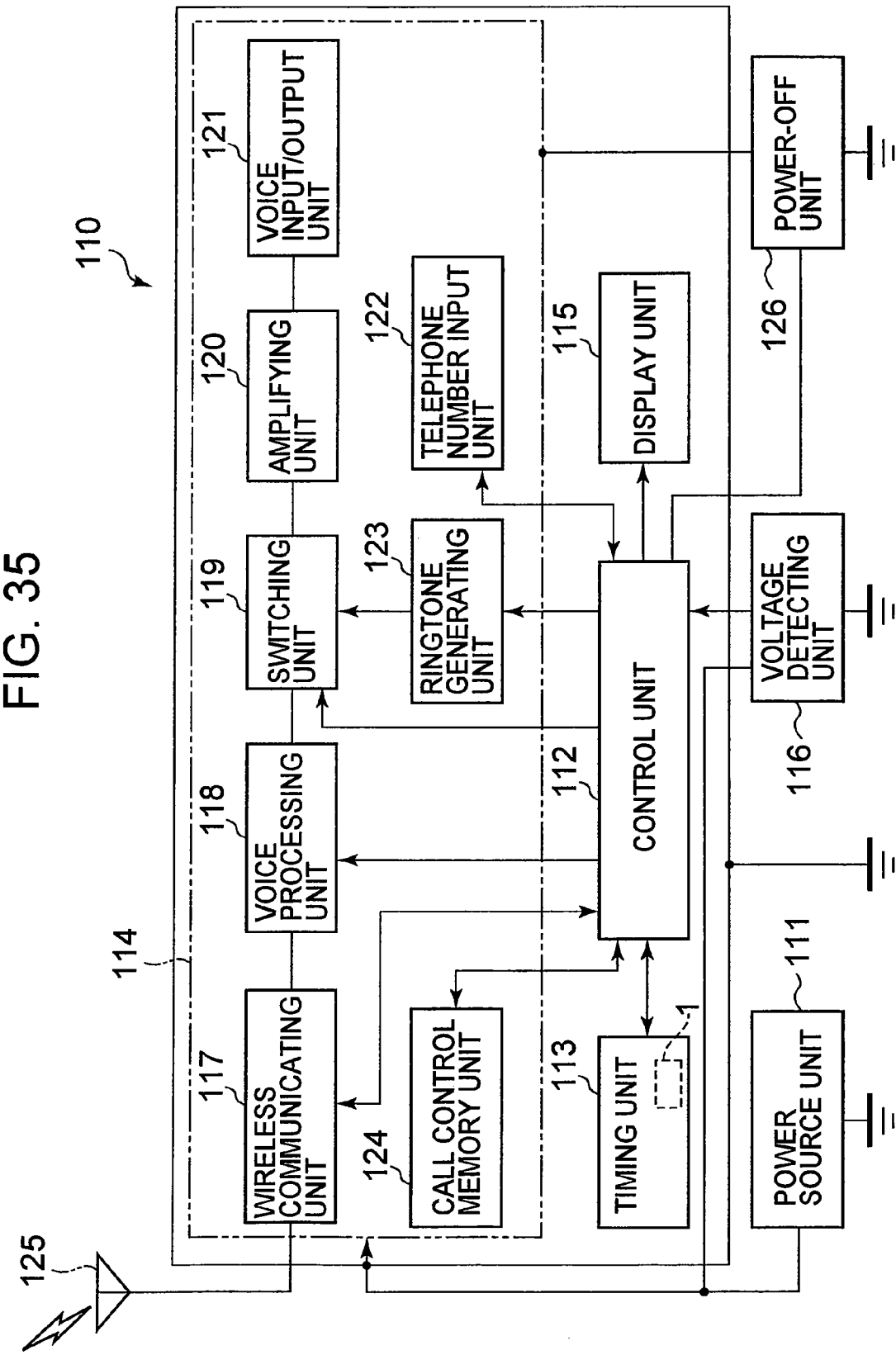
FIG. 35 is a constitution view showing an embodiment of an electronic apparatus according to the invention.

As shown by FIG. 35, the portable information apparatus 110 includes the piezoelectric vibrator 1 and a power source portion 111 for supplying a power. The power source portion 111 is constituted by a lithium secondary cell. The power source portion 111 is connected in parallel with a control portion 112 of carrying out various controls, a time counting portion 113 of counting time or the like, a communicating portion 114 for carrying out a communication with outside, a display portion 115 for displaying various information, and a voltage detecting portion 116 of detecting voltages of various function portions. Further, the power is supplied to the respective function portions by the power source portion 111.

The control portion 112 carries out a control of operating a total of a system of transmitting and receiving voice data, measuring or displaying current time or the like by controlling the respective function portions. Further, the control portion 112 includes ROM previously written with programs, CPU of reading and executing the programs written to ROM, and RAM or the like used as a work area of CPU.

The time counting portion 113 includes an integrated circuit including an oscillating circuit, a register circuit, a counter circuit and an interface circuit or the like, and the piezoelectric vibrator 1. When a voltage is applied to the piezoelectric vibrator 1, the piezoelectric vibrating piece 2 is vibrated, the vibration is converted into an electric signal by a piezoelectric electric property provided to quartz, and is inputted to the oscillating circuit as the electric signal. An output of the oscillating circuit is binalized and counted by the register circuit and the counter circuit. Further, a signal is transmitted and received to and from the control circuit 112 by way of the interface circuit, and current time or current date or calendar information or the like is displayed on the display portion 115.

The communicating portion 114 is provided with a function similar to that of the portable telephone of the background art, and includes a wireless portion 117, a voice processing portion 118, a switching portion 119, an amplifying portion 120, a voice inputting and outputting portion 121, a telephone number inputting portion 122, and arrival sound generating portion 123, and a call control main body portion 124.

The wireless portion 117 exchanges to transmit and receive various data of voice data or the like to and from a base station by way of an antenna 125. The voice processing portion 118 codes and decodes a voice signal inputted from the wireless portion 117 or the amplifying portion 120. The amplifying portion 120 amplifies a signal inputted from the voice processing portion 118 or the voice inputting and outputting portion 121 to a predetermined level. The voice inputting and outputting portion 121 is constituted by a speaker, a microphone or the like for making arrival sound or speech voice loud or collects voice.

Further, the arrival sound generating portion 123 generates arrival sound in accordance with a call from the base station. The switching portion 119 switches the amplifying portion 120 connected to the voice processing portion 118 to the arrival sound generating portion 123 only at arrival of signal, thereby, the arrival sound generated by the arrival sound generating portion 123 is outputted to the voice inputting and outputting portion 121 by way of the amplifying portion 120.

Further, the call control memory portion 124 contains a program related to an emitting and arriving call control of the communication. Further, the telephone number inputting portion 122 includes number keys of 0 through 9 and other key and a telephone number of speech destination or the like is inputted by depressing the number keys and the like.

When a voltage applied to the respective function portions of the control portion 112 and the like by the power source portion 111 becomes lower than a predetermined value, the voltage detecting portion 116 detects the voltage drop to inform to the control portion 112. A predetermined voltage value at this occasion is a value previously set as a minimum voltage necessary for stably operating the communicating portion 114, and becomes, for example, about 3 V. The control portion 112 informed of the voltage drop from the voltage detecting portion 116 prohibits operations of the wireless portion 117, the voice processing portion 118, the switching portion 119 and the arrival sound generating portion 123. Particularly, it is indispensable to stop operating the wireless portion 117 having a large power consumption. Further, the display portion 115 is displayed with a statement that the communicating portion 114 cannot be used by a deficiency in a remaining amount of the battery.

That is, the operation of the communicating portion 114 can be prohibited and the statement can be displayed on the display portion 115 by the voltage detecting portion 116 and the control portion 112. Although the display may be constituted by a character message, as a further intuitive display, a ×(check) mark may be attached to a telephone icon displayed at an upper portion of a display face of the display portion 115.

Further, by providing a power source cutting portion 126 capable of selectively cutting a power source of a portion related to the function of the communicating portion 114, the function of the communicating portion 114 can further firmly be stopped.

According to the portable information apparatus 110 of the embodiment, the above-described piezoelectric vibrator 1 is provided, and therefore, small-sized formation can be achieved similarly also in the portable information apparatus 110 per se and a reliability of a product can be promoted. Further, in addition thereto, highly accurate timepiece information which is stable over a long period of time can be displayed.

Next, an embodiment of a radiowave timepiece 130 according to the invention will be explained in reference to FIG. 36.

Figure 36:
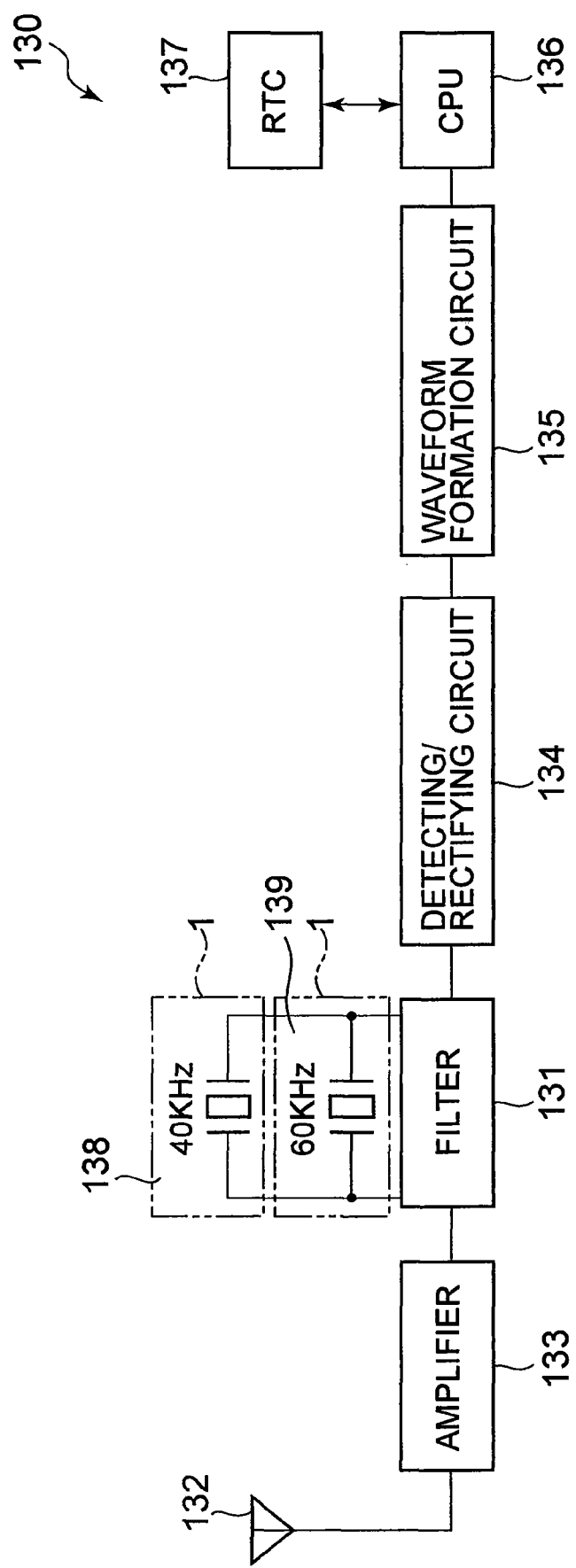
FIG. 36 is a constitution view showing an embodiment of a radiowave timepiece according to the invention.

As shown by FIG. 36, a radiowave timepiece 130 of the embodiment includes the piezoelectric vibrator 1 electrically connected to a filter portion 131, and is a timepiece provided with a function of automatically correcting time to accurate time to display by receiving a standard radiowave including time information.

In Japan, there are transmitting places (transmitting stations) for transmitting a standard radiowave at Fukushima prefecture (40 kHz) and Saga prefecture (60 kHz), respectively transmitting the standard radiowave. A long wave of 40 kHz or 60 kHz is provided with both of a property of propagating on the ground surface and property of propagating while being reflected by the ionousphere and the ground surface, and therefore, a propagating range is wide and all of Japan is covered by the above-describe two transmitting places.

A functional constitution of the radiowave timepiece 130 will be explained in details as follows.

An antenna 132 receives the standard radiowave of the long wave of 40 kHz or 60 kHz. The standard radiowave of the long wave subjects time information referred to as time code an AM modulation to a carrier wave of 40 kHz or 60 kHz. The received standard radiowave of the long wave is amplified by an amplifier 133 and filtered and tuned by the filter portion 131 having a plurality of the piezoelectric vibrators 1.

The piezoelectric vibrator 1 according to the invention is respectively provided with quartz vibrator portions 138, 139 having resonance frequencies of 40 kHz and 60 kHz the same as the carrier frequencies.

Further, the filtered signal of the predetermined frequency is detected and decoded by a detecting and rectifying circuit 134. Successively, a time code is taken out by way of a waveform shaping circuit 135, and counted by CPU 136. CPU 136 reads information of current year, accumulated date, day of week, time or the like. The read information is reflected to RTC 137 and accurate time information is displayed.

The carrier wave is provided with 40 kHz or 60 kHz, and therefore, the vibrator having the structure of the tuning fork type is preferable for the quartz vibrator portions 138, 139.

Further, although the above-described explanation shows the example in Japan, the frequency of the standard radiowave of the long wave differs overseas. For example, in Germany, a standard radiowave of 77.5 kHz is used. Therefore, when the radiowave timepiece 130 capable of dealing with overseas is integrated to the portable apparatus, the piezoelectric vibrator 1 of a frequency which differs from that of the case of Japan is needed.

According to the radiowave timepiece 130 of the embodiment, the above-described piezoelectric vibrator 1 is provided, and therefore, also the radiowave timepiece 130 per se can similarly achieve small-sized formation, and can promote a reliability of a product. Further, in addition thereto, time can be counted stably and highly accurately over a long period of time.

Further, the technical range of the invention is not limited to the embodiment but can variously be modified within the range not deviated from the gist of the invention.

For example, although the pair of exciting electrodes 20, 21 are patterned such that a polarity is reversed at the base end sides and the front end sides of the vibrating arm portions 11, 12 by constituting a boundary by the connecting portion 13a, the invention is not limited to the case. The pair of exciting electrodes 20, 21 may be patterned in anyway so far as the pair of vibrating arm portions 11, 12 can be vibrated in directions of being proximate to and remote from each other.

Further, although in the embodiment, the example is taken by the case in which the base portion 13 supports the gravitational position G of the vibrating arm portions 11, 12 by way of the connecting portions 13a, the vibrating arm portions 11, 12 may be supported at the middle positions from the base ends to the front ends. However, it is preferable to support the gravitational position G since a stable vibrating condition can be maintained by taking a balance in vibration.

Figure 37:
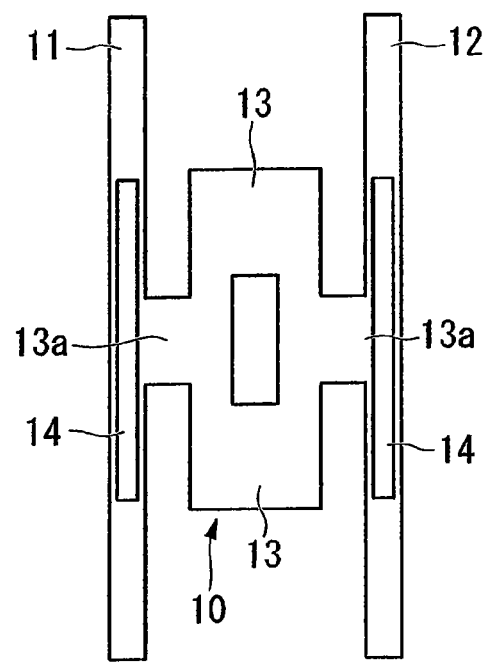
FIG. 37 is a top view showing a modified example of a piezoelectric plate constituting a piezoelectric vibrating piece according to the invention.

Further, a shape of the piezoelectric plate 10 is not limited to the above-described shape. For example, as shown by FIG. 37, two of the base portion 13 may be formed to constitute up and down symmetry centering on the connecting portion 13a.

Figure 38:
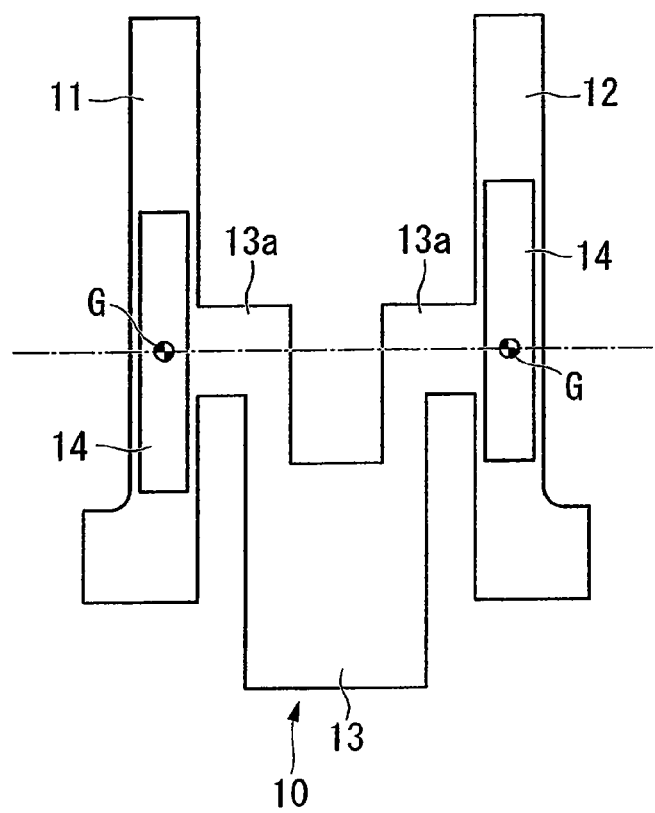
FIG. 38 is a top view showing a modified example of a piezoelectric plate constituting a piezoelectric vibrating piece according to the invention.

Further, as shown by FIG. 38, the vibrating arm portions 11, 12 may respectively be formed such that a uniform transverse width is not constituted from the base end to the front end but the lateral width on the base end side becomes large. Also in this case, similar operation and effect can be achieved. Further, the connecting portions 13a are connected to the gravitational positions G of the vibrating arm portions 11, 12 in the length direction.

Figure 39:
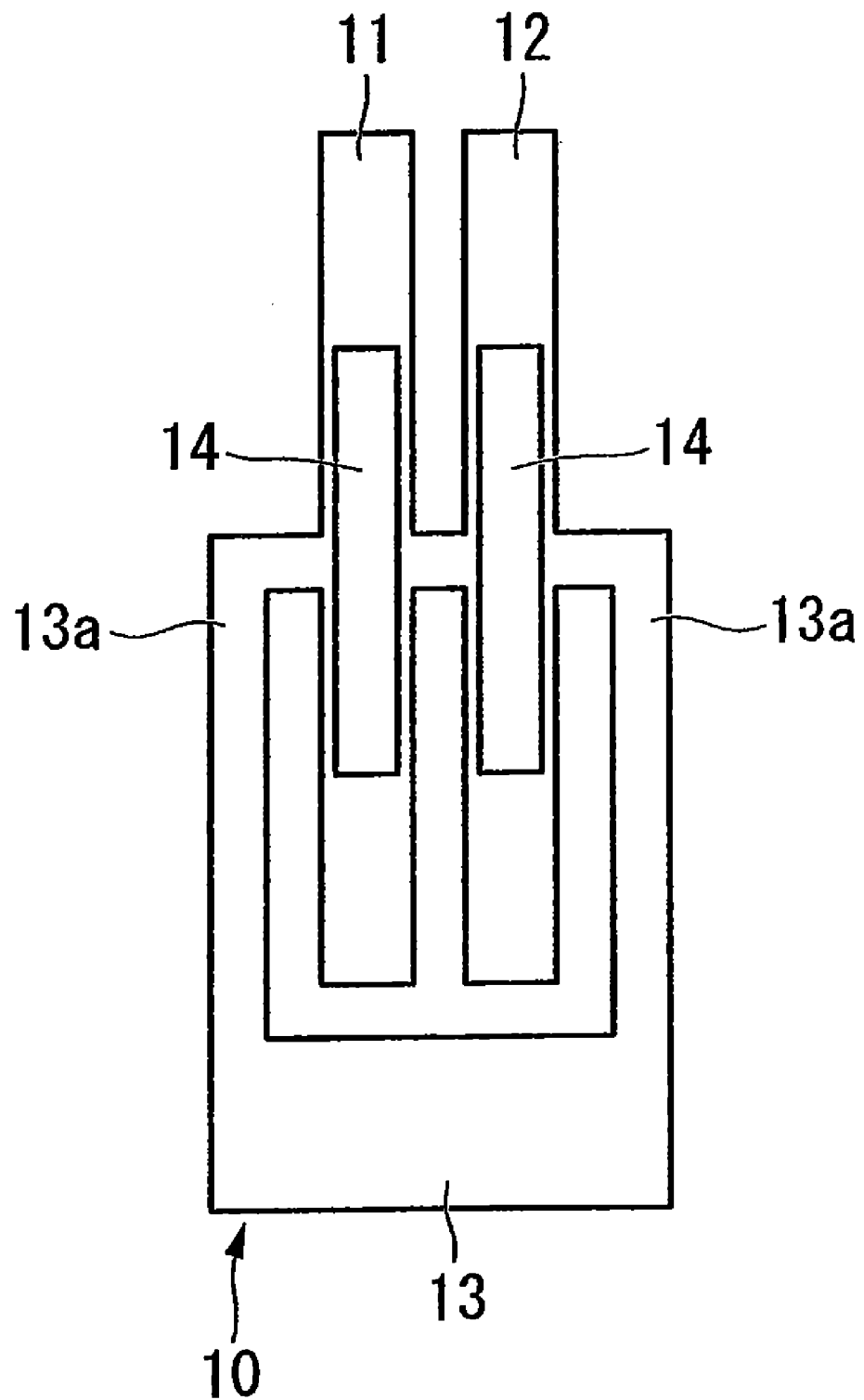
FIG. 39 is a top view showing a modified example of a piezoelectric plate constituting a piezoelectric vibrating piece according to the invention.
Figure 40:
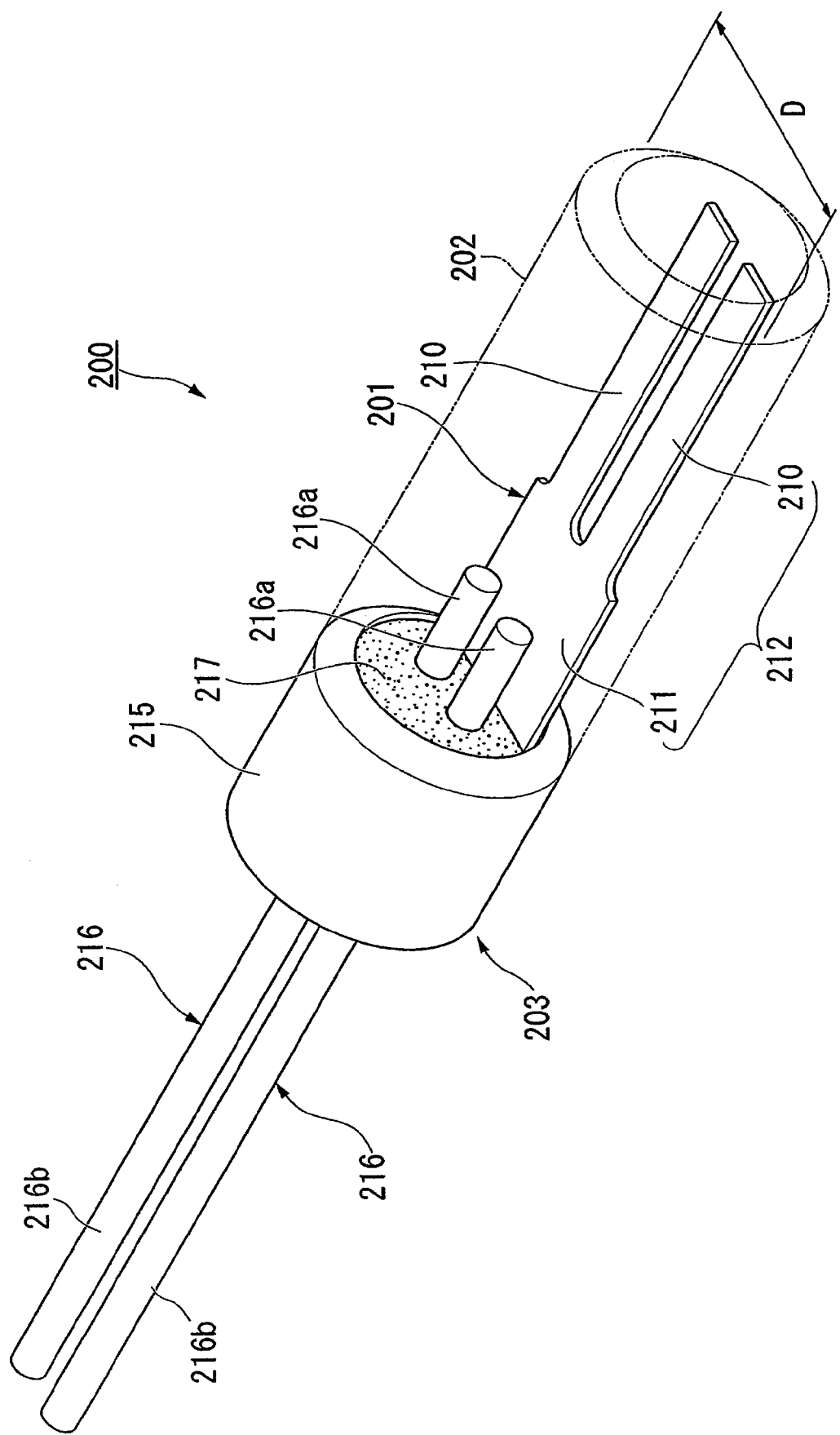
FIG. 40 is a perspective view showing an example of a piezoelectric vibrator of the background art.

Further, as shown by FIG. 39, the connecting portions 13a may be connected to support the pair of vibrating arm portions 11, 12 from outer sides. Also in this case, similar operation and effect can be achieved.

What is claimed is:

1. A piezoelectric vibrating piece comprising:
a piezoelectric plate including a pair of vibrating arm portions arranged in parallel with each other and extended in one direction from base ends to front ends, and a base portion having connecting portions respectively connected to the pair of vibrating arm portions at middle positions with respect to the base ends and the front ends and integrally supporting the pair of vibrating arm portions by way of the connecting portions;
exciting electrodes respectively formed on outer surfaces of the pair of vibrating arm portions for vibrating the pair of vibrating arm portions when a drive voltage is applied thereto; and
a pair of mount electrodes on an outer surface of the base portion and respectively electrically connected to the pair of exciting electrodes;
wherein the base portion is interposed between the pair of vibrating arm portions at least at one portion thereof, and the exciting electrodes are patterned such that polarities thereof are reversed at base end sides and front end sides of the vibrating arm portions.

2. The piezoelectric vibrating piece according to claim 1, wherein the connecting portion is connected to a gravitational center position of the vibrating arm portion in a length direction.

3. The piezoelectric vibrating piece according to claim 2, wherein the exciting electrodes are connected to the mount electrodes by electrode connections residing on the peripheral edges of the connecting portions.

4. The piezoelectric vibrating piece according to claim 1, wherein the pair of vibrating arm portions respectively include groove portions at both faces thereof along the one direction.

5. The piezoelectric vibrating piece according to claim 1, wherein the pair of vibrating arm portions include through holes penetrating both faces thereof along the one direction.

6. The piezoelectric vibrating piece according to claim 5, wherein a side face of the vibrating arm portion includes a reinforcing portion projecting in a width direction of the vibrating arm portion over at least a region in proximity to the through hole.

7. A piezoelectric vibrator comprising the piezoelectric vibrating piece according to claim 1.

8. The piezoelectric vibrator according to claim 7, further comprising:
   a base board configured to mount the piezoelectric vibrating piece at an upper face thereof;
   a lid board bonded to the base board so as to contain the mounted piezoelectric vibrating piece inside a cavity; and
   a pair of outer electrodes on a lower face of the base board and respectively electrically connected to the pair of mount electrodes of the piezoelectric vibrating piece.

9. The piezoelectric vibrator according to claim 7, further comprising:
   a case containing the piezoelectric vibrating piece on an inside thereof; and
   an airtight terminal including a stem having a ring-like shape and press-fit to the inside of the case, two pieces of lead terminals penetrate the stem, one end sides of which comprise inner leads respectively electrically connected to the pair of mount electrodes by interposing the stem therebetween, and other end sides comprise outer leads respectively electrically connected to a position outside the case, and a filing member fixing the lead terminal and the stem and hermetically closing the inside of the case.

10. An oscillator comprising the piezoelectric vibrator according to claim 7 electrically connected to an integrated circuit as an oscillating piece.

11. An electronic apparatus comprising the piezoelectric vibrator according to claim 7 electrically connected to a time counting portion.

12. A radiowave timepiece comprising a piezoelectric vibrator according to claim 7 electrically connected to a filter portion.

* * * * *